US011422469B2

(12) United States Patent
Körner et al.

(10) Patent No.: US 11,422,469 B2
(45) Date of Patent: Aug. 23, 2022

(54) SUPPORTING AN OPTICAL ELEMENT

(71) Applicant: Carl Zeiss SMT GmbH, Oberkochen (DE)

(72) Inventors: Christian Körner, Munich (DE); Christoph Müller, Aalen (DE); Eugen Anselm, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 347 days.

(21) Appl. No.: 16/869,941

(22) Filed: May 8, 2020

(65) Prior Publication Data
US 2020/0356010 A1 Nov. 12, 2020

(30) Foreign Application Priority Data

May 10, 2019 (DE) .......................... 102019112224.4

(51) Int. Cl.
*G02B 7/00* (2021.01)
*G03F 7/20* (2006.01)
*G02B 7/02* (2021.01)
*G02B 7/182* (2021.01)

(52) U.S. Cl.
CPC ............. *G03F 7/7015* (2013.01); *G02B 7/00* (2013.01); *G02B 7/02* (2013.01); *G02B 7/026* (2013.01); *G02B 7/182* (2013.01)

(58) Field of Classification Search
CPC ........... G03F 7/7015; G02B 7/00; G02B 7/02; G02B 7/026; G02B 7/182
USPC ........................................................ 359/871
See application file for complete search history.

(56) References Cited

U.S. PATENT DOCUMENTS

| 7,471,469 | B2 * | 12/2008 | Sorg ..................... G03F 7/70825 |
| | | | 359/811 |
| 7,760,327 | B2 | 7/2010 | Heintel et al. |
| 8,300,317 | B2 * | 10/2012 | Lee .......................... G02B 3/14 |
| | | | 359/666 |
| 9,134,501 | B2 * | 9/2015 | Schaffer ................. G02B 7/026 |

(Continued)

FOREIGN PATENT DOCUMENTS

| EP | 1014139 A2 | 6/2000 |
| JP | H10186196 A | 7/1998 |

OTHER PUBLICATIONS

International Search Report and Written Opinion for PCT Appl No. PCT/EP2020/062866, dated Aug. 18, 2020.

(Continued)

*Primary Examiner* — William R Alexander
(74) *Attorney, Agent, or Firm* — Fish & Richardson P.C.

(57) ABSTRACT

An arrangement of a microlithographic imaging device, such as one that operates in the EUV range, includes a holding device for holding an optical element. The optical element includes an optical surface and defines a plane of main extension, in which the optical element defines a radial direction and a circumferential direction. The holding device includes a base unit and more than three separate holding units. The base unit includes a plurality of support interface units, which are spaced apart from one another in the circumferential direction, for connecting the holding device to a support structure. The holding units are connected to the base unit and distributed along the circumferential direction and spaced apart from one another. The holding units hold the optical element with respect to the base unit.

34 Claims, 3 Drawing Sheets

(56) References Cited

U.S. PATENT DOCUMENTS

| | | | |
|---|---|---|---|
| 2006/0158749 A1* | 7/2006 | Sorg | G02B 7/00 |
| | | | 359/819 |
| 2006/0187430 A1* | 8/2006 | Dodoc | G03F 7/70341 |
| | | | 355/53 |
| 2008/0192215 A1* | 8/2008 | Gellrich | G02B 1/18 |
| | | | 355/30 |
| 2008/0204689 A1 | 8/2008 | Heintel et al. | |
| 2009/0147229 A1* | 6/2009 | Schaffer | G02B 7/026 |
| | | | 359/820 |
| 2010/0165475 A1* | 7/2010 | Lee | G02B 1/06 |
| | | | 359/666 |
| 2010/0195076 A1* | 8/2010 | Mueller | G02B 5/208 |
| | | | 355/67 |
| 2015/0160569 A1* | 6/2015 | Osorio Oliveros | G03F 1/24 |
| | | | 977/734 |
| 2015/0277230 A1* | 10/2015 | Mueller | G03F 1/64 |
| | | | 355/71 |
| 2021/0231903 A1* | 7/2021 | Henriksen | G02B 26/08 |

OTHER PUBLICATIONS

International Preliminary Report on Patentability for PCT Appl No. PCT/EP2020/062866, dated Nov. 16, 2021.

\* cited by examiner

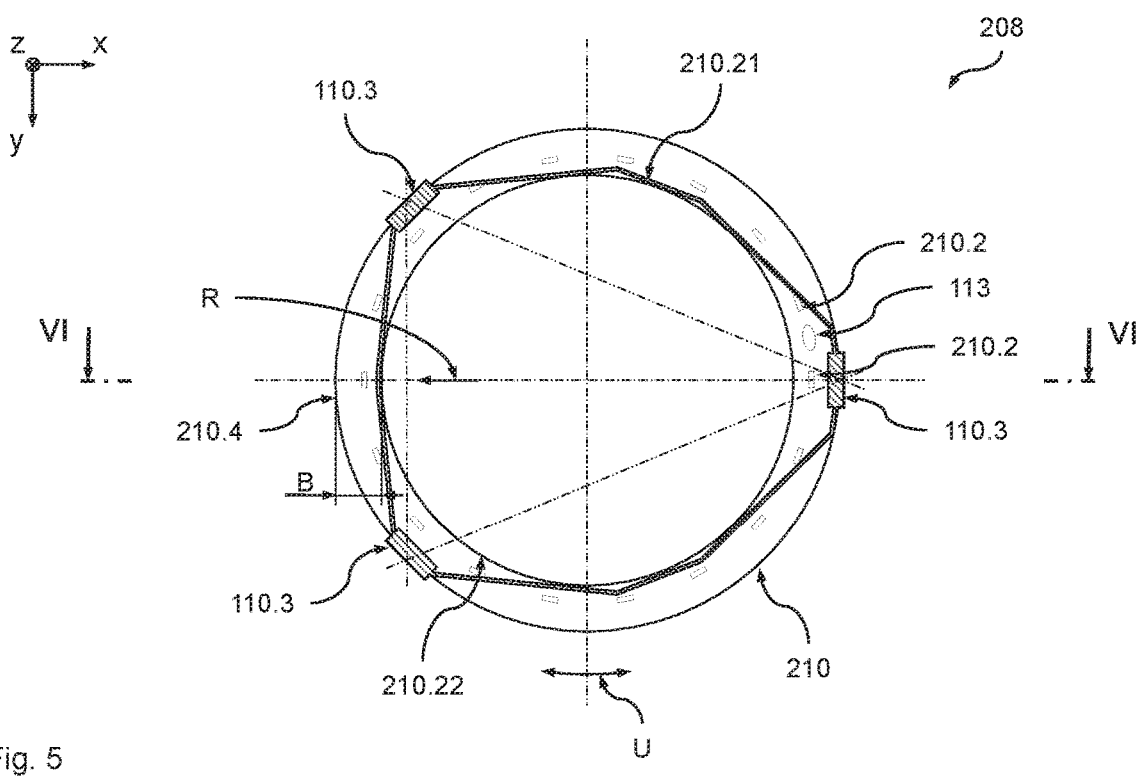
Fig. 5
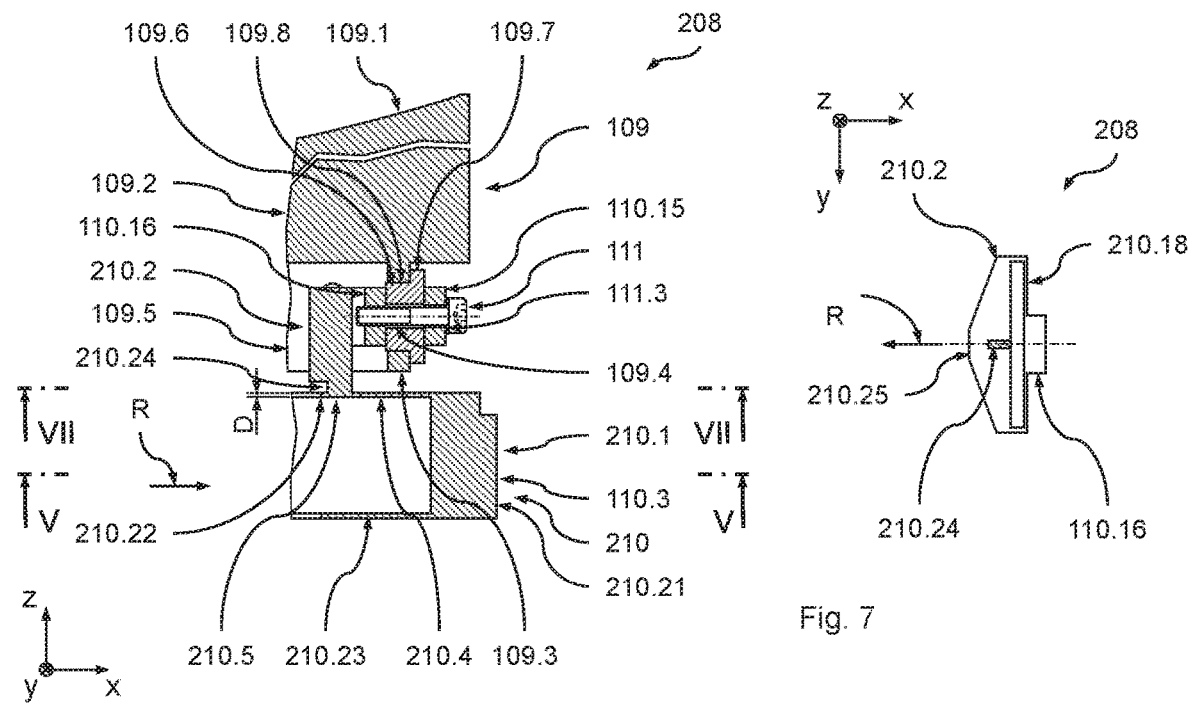
Fig. 6
Fig. 7

SUPPORTING AN OPTICAL ELEMENT

CROSS-REFERENCE TO RELATED APPLICATION

This application claims priority under 35 U.S.C. § 119 to German patent application No. 10 2019 112 224.4, filed May 10, 2019, the entire contents of which are incorporated by reference herein.

FIELD

The present disclosure relates to an optical arrangement for microlithography suitable for utilizing UV imaging light, such as imaging light in the extreme ultraviolet (EUV) range. The disclosure also relates to an optical imaging device that includes such an arrangement. In general, the technology disclosed herein can be used in conjunction with any desired optical imaging methods, such as, for example, producing or inspecting microelectronic circuits and the optical components used for that purpose (e.g., optical masks).

BACKGROUND

The optical devices used in conjunction with the production of microelectronic circuits typically include a plurality of optical element units including one or more optical elements, such as lens elements, mirrors or optical gratings, which are disposed in the imaging light path. The optical elements typically cooperate in an imaging process in order to transfer an image of an object (for example a pattern formed on a mask) onto a substrate (for example a so-called wafer). The optical elements are typically combined in one or more functional groups held, if appropriate, in separate imaging units. For example, in the case of principally refractive systems that operate with a wavelength in the so-called vacuum ultraviolet range (VUV, for example at a wavelength of 193 nm), such imaging units are often formed by a stack of optical modules holding one or more optical elements. The optical modules typically include a supporting structure having a substantially ring-shaped outer supporting unit, which supports one or more optical element holders, the latter in turn holding the respective optical element.

The ever-advancing miniaturization of semiconductor components generally results in a constant demand for increased resolution of the optical systems used for their production. This demand for increased resolution can result in a demand for an increased numerical aperture (NA) and an increased imaging accuracy of the optical systems.

One approach for obtaining an increased optical resolution involves reducing the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In general, in this EUV range it is not appropriate to use conventional refractive optical systems. This is owing to the fact that in this EUV range the materials used for refractive optical systems typically have an absorbance that is too high to achieve acceptable imaging results with the available light power. Consequently, EUV generally involves using reflective optical systems for the imaging.

It is generally desirable for the components of the optical imaging device which cooperate during the imaging process (e.g., the optical elements of the illumination device, the mask, the optical elements of the projection device and the substrate) to be supported in a well-defined manner in order to maintain a predetermined well-defined spatial relationship between these components and to obtain relatively little undesired deformation of these components in order ultimately to achieve desired imaging quality.

U.S. Pat. No. 7,760,327 B2 (Scherle et al.), the entire disclosure of which is incorporated herein by reference, discloses a so-called three-point support by way of three detachable holding units, which are uniformly distributed along the circumference (the holding units typically being designed in the form of so-called hexapod kinematics), for the purposes of supporting the optical units or elements.

U.S. Pat. No. 8,441,747 B2 (Heintel et al.), the entire disclosure of which is incorporated herein by reference, discloses holding an optical element at its external circumference via a plurality of holding units that are adhesively bonded to the external circumference of the optical element and disposed on a support ring.

SUMMARY

The disclosure seeks to provide a microlithographic optical arrangement, a corresponding optical imaging device including such an arrangement, and a method for supporting an optical element, having a small support for an optical element that is both relatively small and relatively robust against shock loads.

The disclosure involves, in part at least, the teaching that a support of the optical element that is robust against shock loads but has a small size can be obtained if a plurality of holding units, optionally more than three holding units, are provided which each separately hold the optical element, wherein the holding units are disposed on at least one support membrane element of the base unit, the support membrane element optionally extending along the circumferential direction and the radial direction. Due, in part at least, to the division of the loads, such as the shock loads, occurring at the optical element during production, transport and operation of the imaging device among the plurality of holding units, optionally more than three holding units, a reduction in the maximum load acting on the single holding unit (e.g., in undesirable scenarios) can be achieved.

A result of disposing the respective holding unit on a support membrane element is that it can be possible to set the stiffness of the holding device between the optical unit-side point of attack of the force of the respective holding unit (at the optical element) and the support structure-side point of attack of the force (of the support structure) at the respective support interface unit by way of the design of the support membrane element and/or by way of the manner in which the support membrane element is connected to the support interface unit. In some embodiments, this can advantageously provide that this stiffness, such as in certain respective degrees of freedom, is relatively substantially equalized for a plurality of holding units (optionally all holding units). In general, the greater this equalizing in a specific degree of freedom (thus, the smaller the differences in stiffness are between the individual holding units in this degree of freedom or the more narrow-band the distribution of this stiffness is among the holding units), the more uniformly the shock loads are divided among the holding units in the respective degree of freedom. In a desirable case, it is even possible for at least substantially the same stiffness to be obtained for all holding units with respect to a support structure-side point of attack of the force in the respective degree of freedom. In this case, a shock load in the respective degree of freedom then is relatively uniformly distributed among all holding units.

Hence, the risk of a shock load expected in a disadvantageous case at a holding unit exceeding the holding force of the holding unit can be relatively reduced without having to provide great safety factors and hence overdimensioning of the holding units. In some embodiments, the shock safety or reliability against system failure under shock load can be increased despite simplified holding units. Accordingly, the holding units can have a simpler and hence more space-saving design, which in turn can facilitate a further increase in the number of holding units. Ultimately, in some embodiments, this may allow the realization of an advantageously large number of holding units with a relatively uniform distribution of the shock loads among the holding units.

In some embodiments, an advantage of the support membrane element lies in the fact that, in addition to the relative increase in stability to shocks, the achievable imaging quality can also improve because the optical element is supported advantageously uniformly at many points and consequently it is possible to substantially reduced a wavy deformation of the optical element caused by its weight. Furthermore, in some embodiments, an advantageously low stiffness of the holding device in relation to the optical element can be obtained by the use of the support membrane element.

In some embodiments, an advantage of the support membrane element lies in the fact that it can decouple the holding units from one another in terms of tilt degrees of freedom, the tilt axes of which lie in the support membrane element. This is due, inter alia, to the fact that the support membrane element can be deformed comparatively easily by denting. Advantageously, in some embodiments, this can obtain a reduction of parasitic stresses that are introduced into the optical element during a deformation of the holding device.

In an aspect, the disclosure provides an arrangement of a microlithographic imaging device, such as for use with light in the extreme UV (EUV) range, including a holding device for holding an optical element. The optical element includes an optical surface and defines a plane of main extension, in which the optical element defines a radial direction and a circumferential direction. The holding device includes a base unit and a plurality of separate holding units (e.g., more than three separate holding units) wherein the base unit, for connecting the holding device to a support structure, includes a plurality of support interface units which are spaced apart from one another in the circumferential direction. The holding units are connected to the base unit and disposed in a manner distributed along the circumferential direction and spaced apart from one another. Furthermore, the holding units are configured to hold the optical element in relation to the base unit. The base unit includes at least one support membrane element, wherein the at least one support membrane element predominantly extends along the circumferential direction and along the radial direction, wherein the at least one support membrane element has a thickness dimension transversely to the circumferential direction and radial direction. Here, the holding units are disposed on a front side of the at least one support membrane element that faces the optical element.

In principle, the support membrane element can have any suitable design and arrangement for obtaining the above-described functions of decoupling and equalizing the stiffness among the individual holding units. By way of example, any wound and/or folded configurations of the membrane element can be realized (in a sectional plane extending perpendicular to the circumferential direction) in order to set the stiffness or compliance in (one or more) specific degrees of freedom in a targeted manner. Thus, the sectional contour of the membrane element can have an at least section-wise straight and/or an at least section-wise polygonal and/or an at least section-wise curved course. Naturally, simple designs can arise in the case of a straight-line course of the sectional contour.

In variants with a particularly simple design, the at least one support membrane element is configured in the manner of a thin-walled ring-shaped disc or in the manner of a thin-walled hollow conical frustum; configurations that can be produced particularly easily can be obtained herewith.

The arrangement of the support membrane element can, in principle, be chosen in an arbitrary suitable manner and a manner adapted to the pairing of the optical element and the holding device (e.g., the holding units) in order to obtain the desired decoupling and/or equalizing of the stiffness among the individual holding units. In certain variants, the at least one support membrane element, in a sectional plane extending in the radial direction and perpendicular to the circumferential direction, is inclined by at most 10° (e.g., by at most 5°, by at most 2°) with respect to the radial direction. In these variants, an expedient narrow band stiffness distribution among the holding units in the degree of freedom perpendicular to the plane of main extension of the optical element can be obtained. Here, the stiffness can be influenced by the aforementioned angle of inclination, with the stiffness perpendicular to the plane of main extension increasing with the angle of inclination. Particularly simple configurations can be obtained if the at least one support membrane element extends at least substantially parallel to the radial direction.

In certain variants, the at least one support membrane element has an inner section and an outer section spaced apart therefrom in the radial direction. Here, the at least one support membrane element can have an intermediate section between the inner section and the outer section which intermediate section can have a more or less large extension (in the radial direction). In addition or as an alternative thereto, at least one of the holding units (e.g., a plurality of the holding units, such as all of the holding units) in the radial direction can be connected to the at least one support membrane element between the inner section and the outer section. With this approach, the potential (in decoupling and/or equalizing of the stiffness) of such a support membrane element can be exploited particularly well. Here, in some embodiments, it may be advantageous if the respective holding element, in the radial direction, is disposed in a central region between the inner section and the outer section.

This can apply in certain variants in which the at least one support membrane element is connected, in the region of the outer section, to a circumferential outer ring structure extending in the circumferential direction. Here, the outer ring structure can completely or partly protrude beyond the support membrane element in the direction of the optical element. Designs that can be manufactured and assembled particularly easily can arise if the outer ring structure is disposed at a back side of the at least one support membrane element that faces away from the front side of the at least one support membrane element (expressed differently, the outer ring structure faces away from the optical element).

In certain variants, it can likewise be advantageous if the at least one support membrane element is connected in the region of the inner section to a circumferential inner ring structure extending in the circumferential direction, for example a thin-walled inner ring structure. The inner ring structure, too, can protrude beyond the support membrane element in the direction of the optical element. Likewise, additionally or alternatively, the inner ring structure can be disposed at a back side of the at least one support membrane element that faces away from the front side of the at least one support membrane element.

In this case, in addition to achieving the desirable increase in stiffness of the holding device, the respective inner and outer ring structure can be advantageous in some embodiments in that an additional adaptation of the stiffness distribution among the holding units is possible in a comparatively simple and flexible manner by way of the design of the ring structure and/or the connecting thereof to the respective support membrane element.

Here, a particularly simple connection of the holding device to the outer support structure is rendered possible in that at least some of the support interface units, for example three support interface units, are formed at the outer ring structure or the inner ring structure. Here, these support interface units can be distributed uniformly along the circumference of the holding device. However, the adaptation potential of the stiffness distribution can take effect particularly well if the support interface units are distributed at irregular intervals along the circumferential direction, for example because this is predetermined by the optical element and/or adjacent components of the imaging device.

In principle, it can be sufficient for only the outer ring structure and/or the inner ring structure to be connected to the respective support membrane element. In certain expedient variants with a good, narrow-band distribution of the stiffness among the holding units, at least one web element is provided which interconnects the outer ring structure and the inner ring structure, wherein, in the direction of the thickness dimension (of the membrane element), a gap is formed between the at least one web element and the at least one support membrane element.

Here, the force flow between the respective support interface unit and the respective holding unit can be directed and distributed in expedient fashion by way of the arrangement and/or design of the web element, as a result of which it is also possible to influence or set, respectively, the stiffness of the respective holding unit in relation to the respective support interface unit.

Here, the gap ensures that the decoupling potential of the support membrane element is not restricted or, where appropriate, influenced in defined manner. Here, the gap may extend over at least 50% (e.g., at least 70%, at least 90%, from 90% to 100%) of the length of the web element between the outer ring structure and the inner ring structure. Naturally, regions in which no gap is present (in which the web element contacts the support membrane element) can then restrict the deformability of the support membrane element in this region. Consequently, such regions can have the effect of increasing stiffness. This stiffening effect can also be used for locally tuning the stiffness by locally closing that gap.

A single web element may possibly be sufficient, depending on the stiffness distribution intended to be obtained among the holding units. In certain variants, at least one pair of web elements assigned to one another is provided, wherein the two web elements of the at least one pair engage the inner ring structure immediately in succession in the circumferential direction; this can allow particularly expedient setting of the force flow, and hence of the stiffness distribution, that is to be obtained. It is understood that, depending on the stiffness distribution to be obtained, any number of pairs of web elements can be provided as a matter of principle. Particularly expedient configurations can typically arise if three such pairs of web elements assigned to one another are provided.

In the case of a plurality of pairs of such web elements, the web elements of different pairs may possibly cross. However, it can be particularly advantageous in some embodiments if the two web elements of the at least one pair engage on the outer ring structure immediately in succession, if there is no such crossing of web elements.

The arrangement or distribution of the web elements over the circumference can be implemented in any suitable fashion, depending on the stiffness distribution among the holding units to be obtained. In certain variants, the two web elements of the at least one pair engage the outer ring structure between two support interface units immediately succeeding each other in the circumferential direction. This can allow a particularly expedient distribution or setting of the force flow, and hence of the stiffness (in one or more degrees of freedom), to be obtained between the support interface units and the holding units.

In principle, the two web elements of the respective pair can have any suitable alignment with respect to one another in order to obtain the desired stiffness distribution. Optionally, the two web elements of the at least one pair each define a longitudinal axis and the two longitudinal axes, in a plan view of the plane of main extension, extend with a mutual inclination of at most 10° (e.g., at most 5°, at most 2°, at most 0°). In the case of 0°, the two web elements extend parallel to one another or possibly collinear with one another.

In addition or as an alternative thereto, the two web elements of the respective pair can also be aligned in any suitable fashion relative to the two ring structures and/or to the support interface units. In certain variants, the two web elements of the at least one pair each can define a longitudinal axis, wherein, in a plan view of the plane of main extension, at least one of the two longitudinal axes, optionally each of the two longitudinal axes, extends with an inclination of at most 30° (e.g., at most 10°, at most 2°) with respect to a connecting line, wherein the connecting line connects the two support interface units at the outer ring structure which immediately succeed each other in the circumferential direction and between which the respective web element (of the pair) engages. Here, within the meaning of the present disclosure, the connecting line between two support interface units is optionally defined by the connection between the points of attack of the resultant support force (of the support structure of the imaging device) at the respective support interface unit. As a result of this, it is possible to obtain a particularly expedient distribution of the force flow between the support interface units and the holding units and, hence, it is possible to obtain an expedient narrow-band stiffness distribution (in one or more degrees of freedom) between the holding units.

In certain variants, the at least one support membrane element, at its back side facing away from its front side, is connected to a circumferential support ring structure extending in the circumferential direction. Here, the support interface units, for example three support interface units, can be formed at the support ring structure. Here too, a uniform distribution of the support interface units over the circumference can be provided. However, in some embodiments, the advantages can take effect particularly well if the support interface units are distributed at irregular intervals along the circumferential direction.

In this design, provision can be made, for the at least one support membrane element to be continuously connected to the support ring structure, for there to be no gap between the support ring structure and the support membrane element. However, it is understood that, in further variants, at least section-wise such a gap can also be provided as in conjunction with the web elements already described above in in order to release, at least section-wise, the deformation capability of the support membrane element in this region.

In these designs, too, the force flow between the support interface units and the individual holding units, and hence the stiffness distribution among the holding units, can be set by way of the design and/or the profile of the support ring structure. In certain variants, to this end, a distance of the support ring structure from the inner section of the at least one support membrane element (for example from an inner edge of the at least one support membrane element) can vary along the circumferential direction between at least two, for example between all, support interface units immediately succeeding each other in the circumferential direction.

In some embodiments, it can be advantageous if the support ring structure connects at least two (optionally all) support interface units immediately succeeding each other in the circumferential direction, substantially along the shortest path, without protruding, in the radial direction, inwardly beyond an inner edge of the at least one support membrane element. Particularly expedient force flow distributions can be obtained herewith.

It will be appreciated that, for the holding device, the combination of the at least one support membrane element and the support ring structure may suffice as a matter of principle. However, in certain variants, the support ring structure is connected on a back side facing away from the support membrane element to at least one stiffening membrane element, which predominantly extends along the circumferential direction and along the radial direction. In some embodiments, this can advantageously increase the stiffness of the holding device overall, as a result of which, for example, high resonant frequencies of the holding device can arise.

In principle, the stiffening membrane element can be designed in any suitable desired way. For example, it can be configured in a manner similar, or even identical, to the support membrane element. Optionally, the at least one stiffening membrane element is configured in the manner of a thin-walled ring-shaped disc or in the manner of a thin-walled hollow conical frustum. Furthermore, in a sectional plane extending in the radial direction and perpendicularly to the circumferential direction, the at least one stiffening membrane element can additionally or alternatively extend with an inclination of at most 10° (e.g., at most 5°, at most 2°) with respect to the radial direction. In some embodiments, it can be particularly advantageous if the at least one stiffening membrane element extends at least substantially parallel to the radial direction. With respect to the design and arrangement of the stiffening membrane element, too, the explanations given above with respect to the support membrane element can apply as a matter of principle, and so reference is made thereto in this respect.

In these designs, too, the holding units can be configured in any suitable form for holding the optical element as a matter of principle. In the designs with the rearward support ring structure, optionally, at least one of two holding units located immediately adjacent in the circumferential direction (optionally each of the holding units) is connected to the at least one support membrane element via a decoupling section. This can easily ensure that a restriction of the deformation capability of the support membrane element by the rearward support ring structure is compensated by this decoupling section. Here, as a matter of principle, the decoupling via the decoupling section can have any design and can be matched to the desired degree or degrees of freedom, respectively. In some embodiments, it can be advantageous if the decoupling section releases a tilt degree of freedom about a tilt axis parallel to the radial direction.

It will be appreciated that, as a matter of principle, a membrane element within the sense of the present disclosure is a thin-walled element, the thickness dimension of which is significantly smaller (typically by at least one order of magnitude) than its dimensions in the other two directions in space. Optionally, in a sectional plane perpendicular to the circumferential direction, a width dimension of the at least one support membrane element is defined, wherein the thickness dimension of the at least one support membrane element is from 2% to 30% (e.g., from 5% to 25%, from 10% to 20%) of the width dimension of the at least one support membrane element. This can allow particularly expedient properties to be obtained with respect to the narrow-band stiffness distribution to be obtained among the holding units. Here, it is understood that the absolute width dimension may have an influence, with the relative thickness dimension also being able to increase with an increasing width dimension. In any case, it can be beneficial for the stiffness of the support membrane element, for example in the direction perpendicular to the plane of main extension, to be at least one order of magnitude smaller than the stiffness of the adjacent components of the base unit (in the corresponding spatial direction).

In addition or as an alternative thereto, the thickness dimension of the at least one support membrane element can vary along the circumferential direction, wherein the thickness dimension can vary, for example, depending on an angular distance to the closest support interface unit along the circumferential direction. Here, provision can be made, for example, for the thickness dimension to increase with increasing angular distance to the closest support interface unit. By way of such a variation in the thickness dimension, it is possible, in each case, to finely set the deformation properties of the respective support membrane element and hence (on its own or together with other measures described herein) obtain the desired narrow-band stiffness distribution among the holding units. In addition or as an alternative thereto, it is naturally also possible for this purpose to vary the thickness dimension of the at least one support membrane element along the radial direction. Here, the thickness dimension, for example, can be varied depending on a desired stiffness profile of the support membrane element in the radial direction.

In addition or as an alternative thereto, the at least one support membrane element may have at least one through opening in at least one region located, in the circumferential direction, between two immediately adjacent holding units, for example in each region between two immediately adjacent holding units. This naturally also yields a corresponding option for taking influence on the deformation properties of the respective support membrane element and, in turn, on the narrow-band stiffness distribution among the holding units.

Optionally, each holding unit includes a holding interface unit for connecting to the optical element, wherein a first stiffness in a first direction perpendicular to the plane of main extension and a second stiffness about an axis parallel to the radial direction is defined for the holding interface unit of each holding unit with respect to a respective one of the support interface units. Here, the holding device, for example the base unit, and for example the at least one support membrane element, then is configured in such a way that, for at least one support interface unit, optionally for all support interface units, and for a group of holding units including at least 80% (e.g., at least 90%, at least 95%, from 95% to 100%) of the holding units, a variation of the first stiffness among the holding units of the group of holding units is at most 900% (e.g., at most 100%, at most 10%, from 10% to 1%) of the smallest first stiffness of the holding units of the group of holding units. In this way, in some embodiments, a particularly expedient, narrow-band stiffness distribution is advantageously obtained in the first direction (perpendicular to the plane of main extension of the optical element).

It is understood that such an adaptation of the stiffness distribution among the holding units for a single degree of freedom, for example the degree of freedom in which the main shock loads are expected, may suffice. Optionally, such an adaptation is also implemented in further degrees of freedom. Likewise, it is naturally possible to also undertake the adaptation in one or more other degrees of freedom only.

In certain variants the holding device, for example the base unit, and for example the at least one support membrane element, may then be configured in such a way that, for at least one support interface unit, optionally for all support interface units, and for a further group of holding units including at least 80% (e.g., at least 90%, at least 95%, from 95% to 100%) of the holding units, a variation of the second stiffness among the holding units of the further group of holding units is at most 900% (e.g., at most 100%, at most 10%, from 10% to 1%) of the smallest second stiffness of the holding units of the further group of holding units. It will be appreciated that the two groups of holding units for the first stiffness (e.g., the first group) and the second stiffness (e.g., the second group) as just mentioned above may be identical. However, they may also be different by one or more holding units.

In principle, the holding units can be designed in any suitable manner to hold the optical element during operation. Here, basically, frictional and/or positive and/or adhesive connection techniques can be used, either individually or in any desired combination. Thus, for example, the holding units can be designed in such a way that a conventional adhesive connection, for example adhesive bonding or the like, is used to connect the optical element.

Detachable connections are used in certain variants. Here, holding units which hold the optical element via a separate clamping connection in each case are optional. Here, the respective clamping connection can ensure a simple releasability of the connection and hence a simple replaceability of the optical element. Moreover, in some embodiments, clamping can be advantageous in that the holding force resulting therefrom (e.g., the friction between the clamping surfaces) can be set with comparatively high precision by way of the contact force at the clamping surfaces. Hence, the risk that a shock load expected in a disadvantageous case at a holding unit exceeds the holding force of the holding unit can be reliably reduced without having to provide great safety factors and hence overdimensioning of the holding units. Consequently, in some embodiments, the shock safety or reliability against failure of the system under shock load can advantageously be increased despite simplified holding units.

In principle, the clamping connection between the respective holding unit and the optical element can be established in any suitable manner. For example, the frictional engagement between one or more respective contact surfaces of the holding unit and the optical element, for clamping, can be brought about in any suitable manner. Thus, a single clamping element can be provided for each holding unit, the clamping element being pressed against a corresponding contact surface on the optical element by way of a suitable tensioning device in order to obtain the frictional engagement of the clamping. For example, the clamping element can be pretensioned against the optical element by way of its own support on the base unit. The corresponding opposing forces can then be applied by one or more adjacent holding units in such a way that the contact forces acting on the optical element in the assembled state cancel one another at least section-wise, but at least cancel one another overall, and a defined position and orientation of the optical element is achieved.

Particularly simple designs arise if at least one of the holding units, optionally each holding unit, includes a holding interface unit for connecting to the optical element, wherein the holding interface unit, for example, includes a first clamping element and a second clamping element. Here, the first clamping element and the second clamping element are simply braced against one another for the purposes of establishing the clamping connection, wherein a holding interface section of the optical element is particularly easily clamped between the first clamping element and the second clamping element. Optionally, such a configuration is chosen for each holding unit since a particularly simple design arises overall in that case.

In some embodiments, a low risk of introducing parasitic stresses into the optical element can arise if the first clamping element and the second clamping element, for the purposes of establishing the clamping connection, are braced against one another via a simple tensioning element. Here, the tensioning element can be designed in the form of a clamping bracket or in the form of a tie rod, for example. Optionally, the tensioning element reaches through a recess in the interface section, as a result of which a particularly uniform distribution of the clamping force can be obtained, for example locally. Here, the tensioning element optionally reaches with play through the recess in the interface section in order to avoid contact between the tensioning element and the interface section of the optical element, the contact otherwise possibly leading to parasitic stresses in the optical element.

Optionally, a compensation spring device is provided, which is configured to reduce tensioning force losses in the tensioning element. In principle, this compensation spring device can be designed in any suitable desired way. By way of example, it can easily be designed in the manner of a cup spring or a cup spring packet (sometimes also referred to as a Belleville washer or a Belleville washer packet, respectively).

In principle, the tensioning element can have any suitable design for obtaining the bracing of the clamping elements against one another and hence the clamping of the interface section. As mentioned, this may relate to a clamping bracket that engages around and braces the two clamping elements. Particularly simple and compact configurations can arise if the tensioning element includes a threaded section that is screwed into one of the clamping elements for bracing purposes. Here, in some embodiments, it can be particularly advantageous if at least one of the clamping elements is connected to the base unit by way of a connection section, wherein the connection section then optionally is configured in such a way that it restricts a rotational degree of freedom about an axis that extends substantially parallel to a longitudinal axis of the threaded section. This can ensure that the connection section takes up at least a majority of the tightening torque of the screw connection in a simple fashion such that no parasitic stresses or only very low parasitic stresses are introduced into the optical element in this respect.

It is understood that each holding unit can have a holding interface unit for connecting the optical element and the respective holding interface unit can be connected to the base unit in any suitable manner as a matter of principle. For example, parts of the holding interface unit, such as, e.g., one of the clamping elements, can be connected to the base unit only indirectly via the aforementioned tensioning element, while other parts, for example the other clamping element, can be connected directly to the base unit. Optionally, at least one of the holding interface units, for example each of the holding interface units, is connected to the support membrane element via a connection section. If use is made of the aforementioned clamping elements, it is possible, for example, for the first clamping element to be connected to the support membrane element via a connection section and/or for the second clamping element to be connected to the supporting membrane element via a connection section.

It is understood that the first clamping element and the second clamping element may be connected to the base unit via a common connection section. However, in other variants, the first clamping element can be connected to the base unit via a first connection section and the second clamping element can also be connected, where used, to the base unit via a (separate) second connection section. Here, in some embodiments, it may be advantageous if the first connection section and the second connection section extend substantially parallel to one another since this achieves a configuration that can be particularly easy to produce and assemble but nevertheless, from a dynamic point of view, is advantageously stiff in certain degrees of freedom. In addition or as an alternative thereto, the first connection section and the second connection section can be configured in the manner of a parallel guide that is configured to guide the clamping elements which are braced against one another substantially parallel to the radial direction. In both variants, the above-described radial compliance (for thermal deformation decoupling purposes) can be obtained with high stiffness in the remaining degrees of freedom which, under certain conditions, can be dynamically advantageous. However, under certain conditions, this high stiffness of the connection can also be counter-productive since it may lead to comparatively high parasitic stresses in the optical element in the case of a deformation of the holding device.

In principle, the connection section can be designed in any desired suitable way. Thus, by way of example, the connection section can be configured in the manner of a leaf spring. This can yield particularly simple, compact and cost-effective variants. In addition or as an alternative thereto, the connection section can be configured to be compliant in the radial direction (of the optical element). In some embodiments, this is advantageous, for example, if the optical element and the holding device have different coefficients of thermal expansion. The radial compliance then allows good thermal deformation decoupling to be obtained between the optical element and the holding device. In addition or as an alternative thereto, the connection section can extend substantially in a plane perpendicular to the radial direction. This also can allow particularly cost-effective and compact configurations to be obtained.

In certain variants, the connection section is configured in such a way that it restricts a rotational degree of freedom about an axis extending substantially parallel to the radial direction. For example, in some embodiments, this can be advantageous if screws, or the like, aligned in the radial direction are used for securing purposes since the connection section then can absorb at least some of the tightening torque (as already described above for a clamping connection).

In principle, the connection section can be aligned in any suitable manner to realize the above-described variants. In certain variants, the connection section defines a longitudinal axis, wherein the longitudinal axis of the connection section then extends substantially perpendicular to the plane of main extension or substantially parallel to the plane of main extension. The above-described radial compliance can be realized in a particularly simple fashion in both cases.

In principle, the optical element may have any design for the purposes of establishing the respective connection to the holding units. Thus, it may include, e.g., a single holding interface section, which is provided for the connection to the holding units. In certain variants, the optical element in each case includes a separate holding interface section for establishing the connection with the respective holding unit, the holding interface section serving for the connection to the respective holding unit. Then, for example, as described above, the holding interface section of the optical element may be clamped between two clamping elements of the holding unit.

The holding interface sections and the holding units may be combinable with one another as desired; e.g., no specific pairing is provided between the holding interface sections and the holding units (for example, the optical element and the base unit with the holding units can thus be arbitrarily rotated with respect to one another along the circumferential direction). In other variants, such a specific pairing is realized by a correspondingly different design and/or arrangement of the components. Here, a holding interface section can be configured to be combinable with a first holding unit but not with a second holding unit.

In principle, the holding interface section of the optical element can be realized at the optical element in any suitable manner. In some embodiments, particularly compact and simple designs can arise if the holding interface section of the optical element is configured by a projection of the optical element. A plurality of holding interface sections can be formed at a common projection of the optical element. Furthermore, all holding interface sections can be formed at a ring-shaped projection of the optical element. The projection of the optical element may extend in the circumferential direction and/or in a direction perpendicular to a plane defined by the circumferential direction and the radial direction.

In principle, the respective holding interface section can be designed in any suitable desired way. By way of example, it may be formed directly on a main body of the optical element. In some variants, they can be executed easily and with high precision, the respective holding interface section can be configured by a holding interface element that is connected to the optical element. Here, the holding interface element may be inserted into a recess of the optical element, wherein the interface element, for example, may be inserted in a recess in a projection of the optical element. Such configurations can be produced particularly easily. The holding interface element may include a connection bushing, for example. The connection bushing may include a collar that facilitates simple and precise production and assembly.

In principle, the optical element can be produced from any suitable material in single part or multi-part fashion. Optionally, the optical element, at least in the region of the projection, is produced from a ceramic material, the ceramic material, for example, including SiSiC, and/or produced from a material including Zerodur and/or from a lens material. Further suitable materials for the optical element include aluminum (Al), aluminum alloys (e.g., aluminum silicon (AlSi)), beryllium (Be), beryllium alloys (e.g., aluminum beryllium (AlBe)), ULE® (Ultra Low Expansion glass by Corning Inc., Corning, N.Y. 14831, US), copper (Cu), molybdenum (Mo), silicon carbide (SiC) and silicon (Si). In variants with an interface element, the latter can be optionally produced from a material including invar and/or stainless steel and/or molybdenum. Further suitable materials for the interface element are aluminum (Al), aluminum alloys (e.g., aluminum silicon (AlSi)), beryllium (Be), beryllium alloys (e.g., aluminum beryllium (AlBe)), ceramic materials (e.g., SiSiC), glass fiber-reinforced plastics (GFRP) and carbon fiber-reinforced plastics (CFRP).

In principle, the optical surface can be any refractive and/or reflective and/or diffractive optical surface. In some embodiments, the advantages specified herein can take effect particularly well if the optical surface is a reflecting optical surface. Then, the optical surface is optionally disposed on a main body of the optical element. The main body then optionally includes at least one projection on a side facing away from the optical surface, the projection forming an interface section to at least one of the holding units.

In principle, the base unit can likewise have any design. In certain compact variants, the base unit has a ring-shaped configuration. Here, the base unit can have a circular ring shape design in the simplest case. However, any other ring forms are also possible, for example rings that are at least section-wise polygonal or rings with a combination of curved and straight segments. Typically, the form of the base unit is matched to the form of the optical element to be supported.

In certain designs, the base unit defines a plane of main extension of the base unit and at least one of the holding units projects from the base unit in a manner substantially perpendicular to the plane of main extension of the base unit. Optionally, this applies to all holding units, such that the holding units all project from the base unit in a manner substantially perpendicular to the plane of main extension of the base unit. In the variant with a ring-shaped base unit, this then yields a crown-like design, in which the holding units project from the ring-shaped base unit in the manner of the tines of a crown.

In principle, the holding device may be built in any suitable manner from a plurality of separate components in a so-called differential design. In certain particularly robust and highly precisely manufactured variants, the base unit has a monolithic configuration. In addition or as an alternative thereto, the support membrane element can be formed to be monolithic with at least one of the holding units (optionally with all holding units).

In principle, any suitable materials can be used for the holding device or the components thereof. This can be, e.g., stainless steel, aluminum (Al) or beryllium (Be), either individually or in any desired combination. Further suitable materials include aluminum alloys (e.g., aluminum silicon (AlSi)), beryllium alloys (e.g., aluminum beryllium (AlBe)), ceramic materials (e.g., SiSiC), glass fiber-reinforced plastics (GFRP) and carbon fiber-reinforced plastics (CFRP).

As already mentioned above, there are optionally as many holding units as possible, the number being restricted by the available installation space depending on the size of the optical element. Optionally, at least 6 (e.g., at least 9, at least 18, from 18 to 36) holding units, are provided. However, significantly more holding units may also be provided, depending on the dimensions of the optical element or the available installation space. Thus, as many holding units as possible are optional in the case of large optical elements. Here, the number of holding units can be 120 or more. The holding units can be disposed in any distribution. For example, the distribution can be adapted to the mass distribution of the optical element and/or to the expected load directions (of shock loads, for example). In certain variants, the holding units are disposed with substantially uniform distribution along the circumferential direction. For example, this can take account of situations where loads may occur in any direction.

In an aspect, the disclosure relates to an arrangement of a microlithographic imaging device, such as for used with light in the extreme UV (EUV) range, including a holding device for holding an optical element. The optical element includes an optical surface and defines a plane of main extension, in which the optical element defines a radial direction and a circumferential direction. The holding device includes a base unit and a plurality of separate holding units, for example, more than three separate holding units. The base unit, for connecting the holding device to a support structure, includes a plurality of support interface units which are spaced apart from one another in the circumferential direction. The holding units are connected to the base unit and disposed in a manner distributed along the circumferential direction and spaced apart from one another. The holding units are configured to hold the optical element with respect to the base unit, wherein each holding unit includes a holding interface unit for connecting to the optical element. With respect to a respective one of the support interface units, a first stiffness in a first direction, for example, in a first direction perpendicular to the plane of main extension, is defined for each holding interface unit of each holding unit. The base unit includes at least one support membrane element, wherein the holding units are disposed on the at least one support membrane element, for example, on a front side of the at least one support membrane element that faces the optical element. At least a part of the holding device including the at least one support membrane element is configured in such a way that, for at least one support interface unit, optionally for all support interface units, and for a group of holding units including at least 80% (e.g., at least 90%, at least 95%, from 95% to 100%) of the holding units, a variation of the first stiffness among the holding units of the group of holding units is at most 900% (e.g., at most 100%, at most 10%, from 10% to 1%) of the smallest first stiffness of the holding units of the group of holding units.

As already mentioned above, as the result of disposing the respective holding unit on a support membrane element, it is possible to set the stiffness of the holding device between the optical unit-side point of attack of the force of the respective holding unit (at the optical element) and the support structure-side point of attack of the force (of the support structure) at the respective support interface unit by way of the design of the support membrane element and/or by way of the manner in which the support membrane element is connected to the support interface unit. Consequently, in some embodiments, what this can advantageously achieve is that this stiffness, for example in certain respective degrees of freedom, is equalized among a plurality of the holding units (optionally all holding units) to the greatest possible extent. In general, the greater this equalizing is in a specific degree of freedom (thus, the smaller the differences in stiffness are between the individual holding units in this degree of freedom or the more narrow-band the distribution of this stiffness is among the holding units), the more uniformly the shock loads are distributed among the holding units in the respective degree of freedom. In the ideal case, it is even possible that at least substantially the same stiffness is obtained for all holding units with respect to a support structure-side point of attack of the force in the respective degree of freedom. In this case, a shock load in the respective degree of freedom then is uniformly distributed among all holding units.

It will be appreciated that this distribution of the stiffness among the holding units may, for example, arbitrarily combined with the features and variants (or feature combinations) as described herein. For example, in some embodiments, the same advantages may be achieved as described above for the respective feature. Hence, reference is explicitly made to the explanations given above.

In an aspect, the disclosure relates to an optical imaging device, for example a microlithographic optical imaging device, including an illumination device including a first optical element group, an object device for receiving an object a projection device including a second optical element group and an image device, wherein the illumination device is configured to illuminate the object and the projection device is configured to project an image of the object onto the image device. The illumination device and/or the projection device includes at least one arrangement according to the disclosure. This makes it possible, in some embodiments, to realize the variants and advantages described above to the same extent, and so reference is made to the explanations given above in this respect.

In an aspect, the disclosure relates to a method for supporting a microlithographic optical element, such as for use with light in the extreme UV (EUV) range, wherein the optical element, which includes an optical surface and defines a plane of main extension, in which the optical element defines a radial direction and a circumferential direction, is held by a holding device. Here, the optical element is held with respect to a base unit of the holding device by a plurality of separate holding units, for example, more than three separate holding units, of the holding device, the holding units being disposed in a manner distributed along the circumferential direction and spaced apart from one another. The base unit is connected to a support structure by way of a plurality of support interface units that are spaced apart from one another in the circumferential direction. Here, at least one support membrane element of the base unit predominantly extends along the circumferential direction and along the radial direction, wherein the at least one support membrane element has a thickness dimension transversely to the circumferential direction and radial direction. The holding units are disposed on a front side of the at least one support membrane element that faces the optical element. This also makes it possible, in some embodiments, to realize the variants and advantages described herein, and so reference is made to the explanations given above in this respect.

In an aspect, the disclosure relates to a method for supporting a microlithographic optical element, such as for use with light in the extreme UV (EUV) range, wherein the optical element (109), which includes an optical surface and defines a plane of main extension, in which the optical element defines a radial direction and a circumferential direction, is held by a holding device. Here, the optical element is held with respect to a base unit of the holding device by a plurality of separate holding units, for example, more than three separate holding units, of the holding device, the holding units being disposed in a manner distributed along the circumferential direction and spaced apart from one another. The base unit is connected to a support structure by way of a plurality of support interface units that are spaced apart from one another in the circumferential direction. Each holding unit includes a holding interface unit that is connected to the optical element. With respect to a respective one of the support interface units, a first stiffness in a first direction, for example, in a first direction perpendicular to the plane of main extension, is defined for each holding interface unit of each holding unit. The holding units are disposed on at least one support membrane element of the base unit, for example, on a front side of the at least one support membrane element that faces the optical element. At least a part of the holding device including the at least one support membrane element is configured in such a way that, for at least one support interface unit, optionally for all support interface units, and for a group of holding units including at least 80% (e.g., at least 90%, at least 95%, from 95% to 100%) of the holding units, a variation of the first stiffness among the holding units of the group of holding units is at most 900% (e.g., at most 100%, at most 10%, from 10% to 1%) of the smallest first stiffness of the holding units of the group of holding units. This also makes it possible, in some embodiments, to realize the variants and advantages described herein, and so reference is made to the explanations given above in this respect.

In some embodiments, in view of a stress-free or defined assembly (with the generation of parasitic stresses in the optical element at least being largely avoided), it can be particularly advantageous with the above methods if the respective connections between three holding units of the holding device and the optical element are established in a first step in such a way that the optical element is secured in space with respect to the base element. Thus, securing in the manner of a conventional three-point support can consequently be realized first. Here, this may relate to three (first) holding units which are specifically designed for this initial attachment of the optical element and which differ from the remaining holding units. For example, these three (first) holding units may have a stiffer design than the remaining (second) holding units. Then, the respective connections between the remaining (second) holding units of the holding device and the optical element are established in a second step, which second step follows the first step. Here, the remaining (second) holding units may, for example, have a significantly lower stiffness in the direction of the movement for clamping purposes than the three (first) holding units so as thus to be able to compensate production inaccuracies without generating noteworthy restoring forces and hence parasitic stresses.

In an aspect, the disclosure provides an arrangement, including a device. The device includes a base unit and a plurality of separate holding units connected to the base unit. The base unit includes a plurality of interface units and a first membrane element. The device is configured to hold an optical element comprising an optical surface. The optical element defines a plane of main extension having a radial direction and a circumferential direction. The interface units are spaced apart from one another in the circumferential direction. The interface units are configured to connect the device to a support structure. The holding units are spaced apart from one another and distributed along the circumferential direction. The holding units are configured to hold the optical element with respect to the base unit. The first membrane element predominantly extends along the circumferential direction and the radial direction. The holding units are supported on a first side of the first membrane element. The first side of the first membrane element faces the optical element.

In an aspect, the disclosure provides an arrangement, including a device. The device includes a base unit and a plurality of separate holding units connected to the base unit. The base unit includes a plurality of interface units and a first membrane element. The device is configured to hold an optical element comprising an optical surface. The optical element defines a plane of main extension having a radial direction and a circumferential direction. The interface units are spaced apart from one another in the circumferential direction. The interface units are configured to connect the device to a support structure. The holding units are spaced apart from one another and distributed along the circumferential direction. The holding units are configured to hold the optical element with respect to the base unit. Each holding unit comprises a holding interface unit to connect to the optical element. With respect to a respective one of the support interface units, each holding interface unit of each holding unit has a first stiffness in a first direction. At least part of the holding device comprising the first membrane element is configured in so that, for at least one support interface unit and for a group of holding units comprising at least 80% of the holding units, a variation of the first stiffness among the holding units is at most 900% of a smallest first stiffness of the group of holding units. The holding units are supported on a first side of the first membrane element. The first side of the first membrane element faces the optical element.

In an aspect, the disclosure provides an optical imaging device that includes an illumination device and a projection device. The illumination device is configured to illuminate an object, and the projection device is configured to project an image of the object onto an image device. The illumination device and/or the projection device includes an arrangement described herein. The optical imaging device can be a microlithographic optical imaging device, such as an EUV microlithographic optical imaging device. The optical imaging device can further include an object device configured to receive the object and/or the image device.

In an aspect, the disclosure provide a method that includes using an arrangement as disclosed herein to support an optical element.

In an aspect, the disclosure provides a method of using an optical imaging device comprising an illumination device and a projection device. The method includes using the illumination device to illuminate an object, and using the projection device to project an image of the object onto an image device. The illumination device and/or the projection device includes an arrangement as disclosed herein.

The arrangement can be configured to be used in a microlithographic imaging device, such as an EUV microlithographic imaging device.

The arrangement can further include the optical element (e.g., a mirror, a lens element, an optical grating).

The arrangement can include the support structure.

The plurality of separate holding units comprises more than two separate holding units (e.g., more than three separate holding units).

The first membrane element can be a thin-walled ring-shaped disc or a thin-walled hollow conical frustum.

The first membrane element, in a plane extending in the radial direction and perpendicular to the circumferential direction, can be inclined by at most 10° (e.g., at most 5°, at most 2°) with respect to the radial direction. Optionally, the first membrane element extends at least substantially parallel to the radial direction.

The first membrane element can have an inner section and an outer section that is spaced apart from the inner section in the radial direction. The first membrane element can have an intermediate section between the inner section and the outer section. In the radial direction, at least one of the holding units can be connected to the first membrane element between the inner and outer sections. In the radial direction, a plurality of the holding units (e.g., each holding unit) can be connected to the first membrane element between the inner and outer sections.

The first membrane element can further include an outer ring structure extending in the circumferential direction wherein, in a region of the outer section, the first membrane element is connected to the outer ring structure. The outer ring structure can be supported at a second side of the first membrane element that faces away from the first side of the first membrane element. The arrangement can further include an inner ring structure extending in the circumferential direction, wherein, in a region of the inner section, the first membrane element is connected to the inner ring structure. The inner ring structure can be a thin-walled structure. The inner ring structure can be supported by the second side of the first membrane element. At least some of the interface units (e.g., at least three of the interface units) can be disposed at the outer ring structure. At least some of the interface units (e.g., at least three of the interface units) can be disposed at the inner ring structure. The interface units can be distributed at irregular intervals along the circumferential direction. The arrangement can further include a web element interconnecting the inner and outer ring structures. The first membrane element can have a thickness dimension transverse to the circumferential direction and radial direction, and, in a direction of the thickness dimension, there can be a gap between the web element and the first membrane element. The gap can extend over at least 50% (at least 70%, at least 90%, from 90% to 100%) of a length of the web element between the inner and outer ring structures. The arrangement can include a pair of web elements assigned to one another, wherein the two web elements of the pair of web elements engage the inner ring structure immediately in succession in the circumferential direction. The arrangement can include a plurality of pairs of web elements, wherein, for each pair of web elements, the two web elements engage the inner ring structure immediately in succession in the circumferential direction. The plurality of pairs of web elements comprises three pairs of web elements. The two web elements of a given pair of web elements can engage the outer ring structure immediately in succession in the circumferential direction. The two web elements of a given pair of web elements can engage the outer ring structure between two interface units that immediately succeed each other in the circumferential direction. The two web elements of a given pair of web elements can each define a longitudinal axis and the two longitudinal axes, in a plan view of the plane of main extension, extend with a mutual inclination of at most 10° (e.g., at most 5°, at most 2°, 0°). The two web elements of a given pair of web elements can each define a longitudinal axis and at least one of the two longitudinal axes, in a plan view of the plane of main extension, extends with an inclination of at most 30° (e.g., at most 10°, at most 2°) with respect to a connecting line that connects two interface units at the outer ring structure which immediately succeed each other in the circumferential direction, and the respective web element engages between the two interface units.

The first membrane element can further include a ring structure extending in the circumferential direction, wherein, at the second side facing away from the front side, the first membrane element is connected to a ring structure. The plurality of interface units can be supported by the ring structure. The plurality of interface units can include three interface units. The interface units can be distributed at irregular intervals along the circumferential direction. A distance of the ring structure from the inner section of the first membrane element can vary along the circumferential direction between at least two interface units immediately succeeding each other in the circumferential direction. The inner section of the first membrane element can have an inner edge of the first membrane element. The distance can vary along the circumferential direction between all the interface units immediately succeeding each other in the circumferential direction. The ring structure can connect at least two interface units (e.g., all the interface units) immediately in succession in the circumferential direction substantially along the shortest path without protruding, in the radial direction, inwardly beyond an inner edge of the first membrane element. The arrangement can further include a second membrane element which predominantly extends along the circumferential direction and along the radial direction, wherein the ring structure is connected to the second membrane element on a side facing away from the first membrane element. The second membrane element can be a thin-walled ring-shaped disc or a thin-walled hollow conical frustum. In a plane extending in the radial direction and perpendicular to the circumferential direction, the second membrane element extends with an inclination of at most 10° (e.g., at most 5°, at most 2°) with respect to the radial direction. Optionally, the second membrane element extends at least substantially parallel to the radial direction. At least one holding unit (e.g., each holding unit) located immediately adjacent in the circumferential direction can be connected to the first membrane element via a decoupling section. The decoupling section can be configured to release a degree of freedom about a tilt axis parallel to the radial direction.

The first membrane element can have a thickness dimension transverse to the circumferential direction and radial direction. The first membrane element can have a width dimension in a plane perpendicular to the circumferential direction. The thickness dimension of the first membrane element is from 2% to 30% (e.g., from 5% to 25%, from 10% to 20%) of the width dimension of the first membrane element.

The first membrane element can have a thickness dimension transverse to the circumferential direction and radial direction, and the thickness dimension of the first membrane element can vary along the circumferential direction.

The first membrane element can have a thickness dimension transverse to the circumferential direction and radial direction, and the thickness dimension of the first membrane element can vary depending on an angular distance to the closest interface unit along the circumferential direction. For example, the thickness dimension can increase with increasing angular distance to the closest interface unit.

The first membrane element can have a thickness dimension transverse to the circumferential direction and radial direction, and the thickness dimension of the first element can vary along the radial direction, wherein the thickness dimension.

The first membrane element can have a thickness dimension transverse to the circumferential direction and radial direction, and the thickness dimension of the first element can depend on a stiffness profile of the first membrane element in the radial direction.

The first membrane element can include a through opening in a region located, in the circumferential direction, between two immediately adjacent holding units. For example, the first membrane element can include a plurality of through openings in respective regions located, in the circumferential direction, between two immediately adjacent holding units.

Each holding unit can include a holding interface unit configured to connect the optical element. With respect to its respective interface unit, each holding unit can have a first stiffness in a direction perpendicular to the plane of main extension and a second stiffness about an axis parallel to the radial direction. At least one component of the holding device is configured in so that, for at least one interface unit (e.g., all the interface units) and for a group of holding units comprising at least 80% (e.g., at least 90%, at least 95%, from 95% to 100%) of the holding units, a variation of the first stiffness among the holding units is at most 900% (e.g., at most 100%, at most 10%, from 10% to 1%) of a smallest first stiffness of the group of holding units. At least one component of the holding device can be the base unit or the first membrane element. The component of the holding device is configured in such a way that, for at least one interface unit and for a further group of holding units comprising at least 80% (e.g. at least 90%, at least 95%, from 95% to 100%) of the holding units, a variation of the second stiffness among the holding units of the further group of holding units is at most 900% (e.g., at most 100%, at most 10%, from 10% to 1%) of a smallest second stiffness of the holding units of the further group of holding units.

Each holding unit can be configured to establish a clamping connection between the optical element and the base unit. The clamping connection can be separate from the other holding units. At least one of the holding units (e.g., all holding units) can include a holding interface unit configured to connect the optical element. The holding interface unit can include the first and second clamping elements braced against one another to establish the clamping connection. A holding interface section of the optical element can be clamped between the first and second clamping elements. The first membrane element can further include a tensioning element, wherein, to establish the clamping connection, the first and second clamping elements are braced against one another via the tensioning element. The tensioning element can extend through a recess of the holding interface section (e.g., with play). The arrangement can further include a spring device configured to reduce tensioning force losses in the tensioning element.

Each holding unit can include a holding interface unit configured to connect to the optical element, and at least one holding interface unit (e.g., each holding interface unit) can be connected to the first membrane element via a connection section. The connection section can be configured to restrict a rotational degree of freedom about an axis extending substantially parallel to the radial direction. At least section-wise, the connection section can be configured in the manner of a leaf spring. The connection section can be compliant in the radial direction. At least section-wise, the connection section can extend substantially in a plane perpendicular to the radial direction. The connection section can define a longitudinal axis extending substantially perpendicular to the plane of the main extension. The connection section can define a longitudinal axis extending substantially parallel to the plane of the main extension.

At least one holding interface section (e.g., a plurality of holding interface sections, such as, for example, all holding interface sections) of the optical element can include a projection of the optical element. The projection of the optical element can extend in the circumferential direction. The projection of the optical element can extend in a direction perpendicular to a plane defined by the circumferential direction and the radial direction. At least one holding interface section of the optical element can include a holding interface element connected to the optical element. The holding interface element can be in a recess of the optical element. The recess can be a recess in a projection of the optical element. The holding interface element can include a connection bushing, such as a bushing with a collar. At least in a region of the projection, the optical element can include a ceramic material (e.g., SiSiC), Zerodur, or a lens material. The interface element can include invar, stainless steel or molybdenum.

The optical surface can be a reflecting optical surface.

The optical surface can be supported by a main body of the optical element, and the main body can include a projection on a side facing away from the optical surface.

The projection can define an interface to at least one of the holding units.

The base unit can be a ring-shaped configuration.

The base unit can define a plane of the main extension of the base unit, and at least one of the holding units (e.g., all of the holding units) can project from the base unit substantially perpendicular to the plane of the main extension of the base unit. The base unit can be monolithic.

The first membrane element can be monolithic with at least one of the holding units.

The arrangement can include at least six (e.g., at least nine, at least 18, from 18 to 36) holding units.

The holding units can be substantially and uniformly distributed along the circumferential direction.

The base unit can include a plurality of first membrane elements. For each first membrane element, the first membrane element predominantly can extend along the circumferential direction and the radial direction; and the holding units are supported on a side of the first membrane element facing the optical element.

Further aspects and embodiments of the disclosure become apparent from the claims and the following description of embodiments, which relates to the accompanying figures. All combinations of the disclosed features, irrespective of whether or not they are the subject of a claim, lie within the scope of protection of the disclosure.

BRIEF DESCRIPTION OF THE DRAWINGS

FIG. 5 is a schematic sectional view (in a plan view of the back side) of a variant of the arrangement from FIG. 2 (similar to the view of FIG. 4 and along the line V-V of FIG. 6).

FIG. 6 is a schematic sectional view (along the line VI-VI in FIG. 5) of a part (detail D) of the arrangement from FIG. 5.

FIG. 7 is a schematic sectional view (along the line VII-VII in FIG. 6) of a part of the arrangement from FIG. 5.

DETAILED DESCRIPTION OF THE DISCLOSURE

First Embodiment

Figure 1:
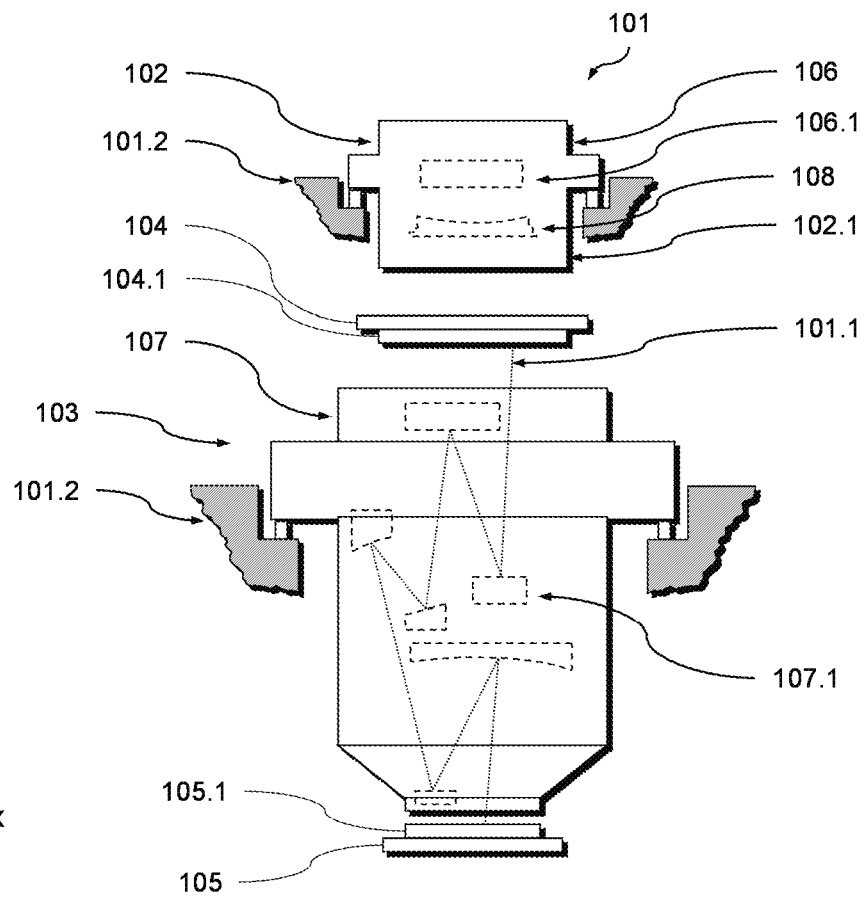
FIG. 1 is a schematic illustration of an embodiment of a projection exposure apparatus which includes an optical arrangement.

An embodiment of a microlithographic projection exposure apparatus 101 according to the disclosure, which includes an embodiment of an optical arrangement according to the disclosure, is described below with reference to FIGS. 1 to 4. To simplify the following explanations, an x, y, z coordinate system is indicated in the drawings, the z direction corresponding to the direction of the gravitational force. It goes without saying that it is possible in further configurations to choose any desired other orientations of an x, y, z coordinate system.

FIG. 1 is a schematic, not-to-scale representation of the projection exposure apparatus 101, which is used in a microlithographic process for producing semiconductor components. The projection exposure apparatus 101 includes an illumination device 102 and a projection device 103. The projection device 103 is designed to transfer, in an exposure process, an image of a structure of a mask 104.1, which is disposed in a mask unit 104, onto a substrate 105.1, which is disposed in a substrate unit 105. For this purpose, the illumination device 102 illuminates the mask 104.1. The optical projection device 103 receives the light from the mask 104.1 and projects the image of the mask structure of the mask 104.1 onto the substrate 105.1, such as for example a wafer or the like.

The illumination device 102 includes an optical unit 106 including an optical element group 106.1. The projection device 103 includes a further optical unit 107 including an optical element group 107.1. The optical element groups 106.1, 107.1 are disposed along a folded central ray path 101.1 of the projection exposure apparatus 101. Each optical element group 106.1, 107.1 can include a plurality of optical elements.

In the present embodiment, the projection exposure apparatus 101 operates with exposure light in the EUV range (extreme ultraviolet radiation), with wavelengths of between 5 nm and 20 nm, for example with a wavelength of 13 nm. The optical elements of the element groups 106.1, 107.1 of the illumination device 102 and the projection device 103 are therefore exclusively reflective optical elements. The optical element groups 106.1, 107.1 may include one or more optical arrangements according to the disclosure, as is described below on the basis of the optical arrangement 108. The optical units 106 and 107 are each supported by way of a support structure 101.2.

In further configurations of the disclosure, it is also possible (e.g., depending on the wavelength of the illumination light), of course, to use any type of optical element (refractive, reflective, diffractive) alone or in any desired combination for the optical modules.

Figure 2:
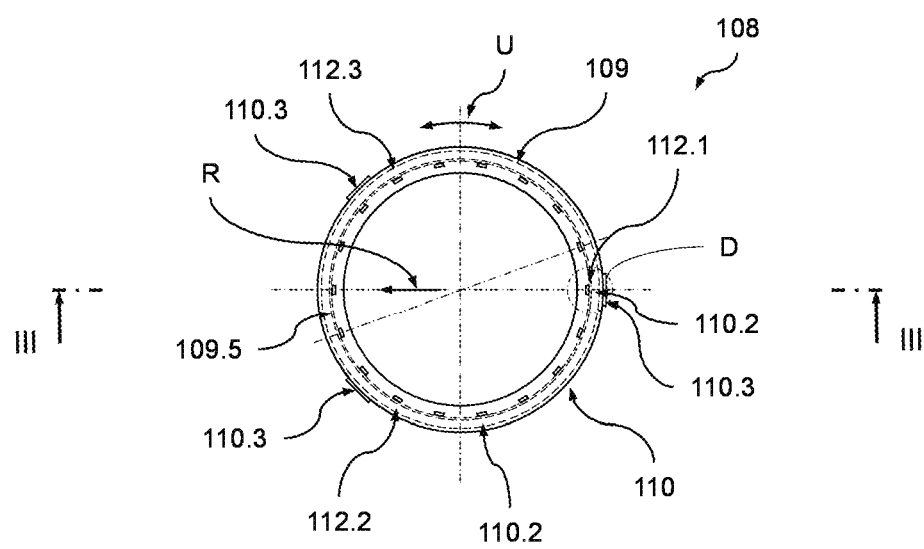
FIG. 2 is a schematic plan view of the front side of the holding device of the arrangement from FIG. 1.

The arrangement according to the disclosure is described below in exemplary manner on the basis of the arrangement 108. FIG. 2 shows a schematic plan view of a front side of part of the arrangement 108, while FIG. 3 shows a schematic sectional view (along the line 111-111 from FIG. 2) of part of the arrangement 108 and FIG. 4 shows a schematic plan view of a back side of the part of the arrangement 108 from FIG. 2.

Figure 3:
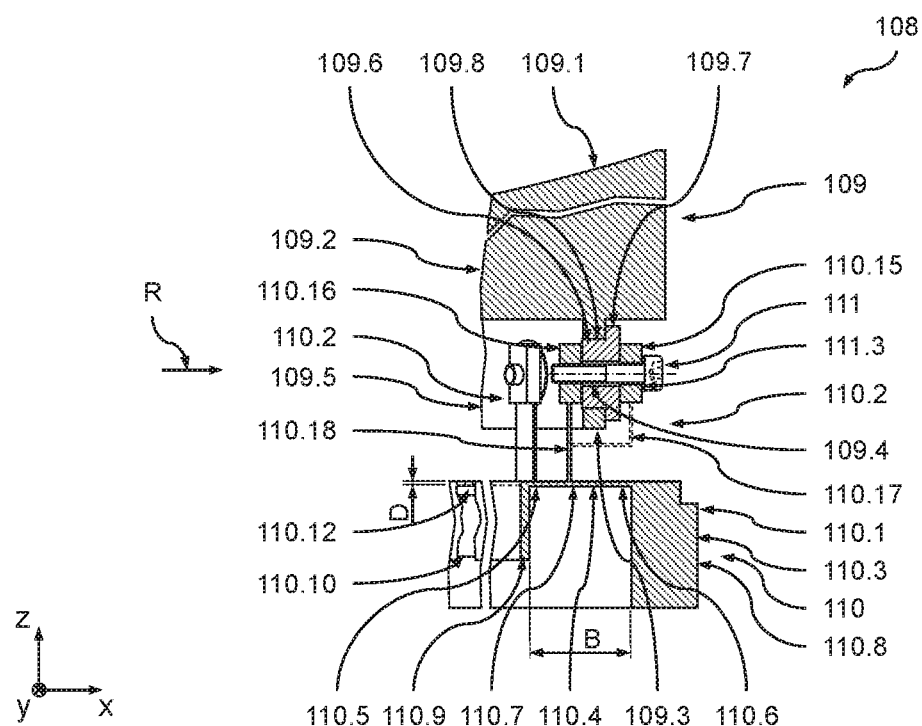
FIG. 3 is a schematic sectional view (along the line III-III in FIG. 2) of a part (detail D) of the arrangement from FIG. 2.
Figure 4:
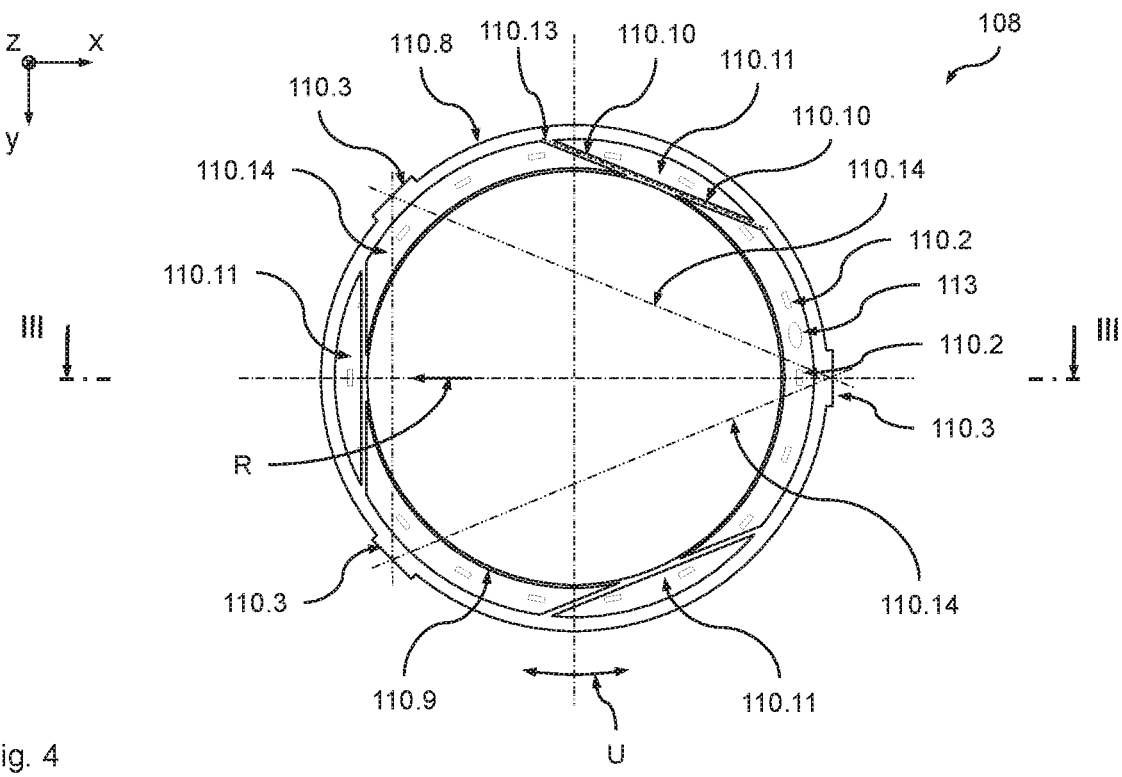
FIG. 4 is a schematic plan view of the back side of the holding device of the arrangement from FIG. 1.

As may be gathered from FIG. 2 and, for example, FIG. 3 (which shows the detail D of FIG. 2), in the present example, the arrangement 108 is an optical arrangement and includes an optical element 109 in the form of a collector mirror of the illumination device 102 and a holding device 110 for holding the optical element 109. Here, FIG. 2 shows a plan view of the front side of the holding device 110 (along the z-direction), which faces the optical element 109. In FIG. 2, the optical element 109 is indicated by its dashed external contour.

The optical element 109 includes a reflective optical surface 109.1 which is formed (in conventional fashion) on one side (the front side) of a main body 109.2 of the optical element 109. The optical element 109 defines a plane of main extension (parallel to the xy-plane or plane of the drawing of FIG. 2), in which the optical element 109 defines a radial direction R and a circumferential direction U.

In the present example, the holding device 110 includes a base unit 110.1 and separate holding units 110.2, wherein the holding units 110.2 are connected to the base unit 110.1 and disposed in a manner distributed along the circumferential direction U and spaced apart from one another. The holding units 110.2 hold the optical element 109 with respect to the base unit 110.1 in a predeterminable position and orientation. In the present example, each holding unit 110.2 establishes a clamping connection between the optical element 109 and the base unit 110.1, the clamping connection being separate from the other holding units 110.2. However, it is understood that any other connection technique can be employed in other variants between the respective holding unit 110.2 and the optical element 109.

As already mentioned, there optionally are as many holding units 110.2 as possible, the number being restricted by the available installation space depending on the size of the optical element 109. In the present example 18 holding units 110.2 are provided. However, a different number may also be provided in other variants. For example, at least 6 (e.g., at least 9, at least 18, from 18 to 36) holding units 110.2 may be provided with certain variants.

In the present example, the holding units 110.2 are disposed uniformly distributed along the circumferential direction U with an angular spacing of 20° in each case. What this can achieve is that the attachment always has substantially the same behavior, independently of the load direction of a load, for example a shock load, introduced into the optical element, or that there is no specific load direction in which shock loads involve an increased risk of a misalignment of the optical element 109.

However, it is understood that, in other variants, the holding units 110.2 may be disposed as desired with an at least section-wise irregular distribution. For example, the distribution of the holding units 110.2 may be adapted in these cases to the mass distribution of the optical element 109 and/or to expected accelerations of the arrangement 108 and load directions resulting therefrom. The holding units 110.2 may be exposed to higher loads in certain regions, particularly in the case of an asymmetric optical element 109, and so it may be expedient to have an asymmetric distribution with a concentration of the holding units 110.2 (e.g., a locally greater number of holding units per circumferential angle) in these regions with a higher load to be expected during operation.

Furthermore, the base unit 110.1 includes a plurality of support interface units 110.3, which are spaced apart from one another in the circumferential direction U, for connecting the holding device 110 to a support structure 102.1 of the illumination device 102. In the present example three support interfaces 110.3 are provided. However, it is understood that any other (smaller or greater) number of support interfaces 110.3 can be provided in other variants.

As may be gathered from FIG. 3, the base unit 110.1 includes a support membrane element 110.4. The support membrane element 110.4 extends predominantly along the circumferential direction U and along the radial direction R, wherein it has a thickness dimension D transversely (more precisely, in the present example, perpendicular) to the circumferential direction U and the radial direction R. Here, the holding units 110.2 are disposed on a front side of the support membrane element 110.4 that faces the optical element 109.

As explained in more detail below, furthermore, disposing the holding units 110.2 on the support membrane element 110.4 renders it possible to set the stiffness of the holding device 110 between the optical unit-side point of attack of the force of the respective holding unit 110.2 (at the optical element 109) and the support structure-side point of attack of the force (of the support structure 102.1) at the respective support interface unit 110.3 by way of the design of the support membrane element 110.4 and/or by way of the manner in which the support membrane element 110.4 is connected to the support interface units 110.3.

Thus, in some embodiments, what this can advantageously achieve is that this stiffness, for example, in certain relevant degrees of freedom, is equalized to the greatest possible extent among a plurality of holding units 110.2, doing so for all holding units being the most expedient case. In general, the greater this equalizing of the stiffness in a specific degree of freedom (thus, the smaller the differences in stiffness are between the individual holding units 110.2 in this degree of freedom or the more narrow-band the distribution of this stiffness is among the holding units 110.2), the more uniformly the shock loads are divided among the holding units 110.2 in the respective degree of freedom. In the ideal case, it is even possible that for all holding units 110.2, in the respective degree of freedom, at least substantially the same stiffness obtained with respect to a support structure-side point of attack of the force at a support interface unit 110.3. In this case, a shock load in the respective degree of freedom then is uniformly distributed among all holding units 110.2.

Hence, in some embodiments, the risk that a shock load to be expected in a disadvantageous case at a holding unit 110.2 exceeds the maximum attainable holding force of the holding unit can be reliably reduced without having to provide great safety factors and hence overdimensioning the holding units 110.2. Consequently, in some embodiments, the shock safety or reliability against failure of the system under shock load can advantageously be increased despite having holding units 110.2 with a comparatively simple design. Accordingly, the holding units 110.2 can have a simpler and hence more space-saving design, which in turn facilitates a further increase in the number of holding units 110.2. Ultimately, in some embodiments, this may allow the realization of an advantageously large number of holding units 110.2 with a uniform distribution of the shock loads among the holding units 110.2.

In some embodiments, an advantage of the support membrane element 110.4 lies in the fact that it decouples the holding units 110.2 from one another in terms of tilt degrees of freedom, the tilt axes of which lie in the support membrane element 110.4. For example, it is possible to realize a decoupling about tilt axes that extend parallel to the radial direction R. This is due, inter alia, to the fact that the support membrane element 110.4 can be deformed comparatively easily by bulging. As a result of this (e.g., in the case of a deformation of the base unit 110.1), the holding units 110.2 can tilt relative to one another about these tilt axes, as a result of which the introduction of deformation-induced parasitic stresses into the optical element 109 via the holding units 110.2 is reduced.

In the present example, the support membrane element 110.4 is designed in a particularly simple fashion in the manner of a thin-walled ring-shaped disc. However, it is understood that a ring-shaped circumferential membrane need not be used in other variants. Instead, a plurality of individual support membrane elements 110.4 may be provided, for example, which are configured in the manner of ring segments.

It is furthermore understood that the support membrane element 110.4 may also be configured in the manner of a thin-walled hollow conical frustum in other variants. Likewise, in other variants, the support membrane element 110.4 can have another suitable design and arrangement for obtaining the above-described functions of decoupling and equalizing the stiffness among the individual holding units 110.2. By way of example, any wound and/or folded configurations of the support membrane element 110.4 may be realized (in a sectional plane extending perpendicular to the circumferential direction U) in order to set the stiffness or compliance of the holding device 110 in (one or more) specific degrees of freedom in a targeted manner. Thus, the sectional contour of the support membrane element 110.4 can then have an at least section-wise straight and/or an at least section-wise polygonal and/or an at least section-wise curved course. Naturally, particularly simple designs arise in the case of a straight-line course of the sectional contour, as is the case in the present example.

The design of the support membrane element 110.4 as a ring-shaped disc causes the support membrane element 110.4 to extend, in a sectional plane that extends in the radial direction R and perpendicular to the circumferential direction U, parallel to the radial direction R, and consequently with an inclination of 0° with respect to the radial direction R, as this yields, in the present example, particularly good adaptation to the geometric conditions of the optical element 109 and of the holding units 110.2. In the present case this, for example, enables an expediently narrow-band stiffness distribution among the holding units 110.2 in the degree of freedom perpendicular to the plane of main extension of the optical element 109 (along the z-direction in the present example).

However, it is understood that the arrangement of the support membrane element 110.4 can also be disposed differently in other variants in order to obtain a configuration matched to the pairing of the optical element 109 and the holding device 110 (e.g., the holding units 110.2), by which the desired decoupling and/or equalizing of the stiffness is obtained for the individual holding units 110.2. Optionally, the respective support membrane element 110.2, in a sectional plane, which extends in the radial direction R and perpendicular to the circumferential direction U, extends with an inclination of at most 10° (e.g., at most 5°, at most 2°) with respect to the radial direction. Herewith, depending on the use case, it is also possible to obtain expediently narrow-band stiffness distributions among the holding units 110.2 in certain degrees of freedom, for example in the degree of freedom perpendicular to the plane of main extension of the optical element 109.

In the present example, the support membrane element 110.4, in the radial direction R, has an inner section 110.5 and, at a distance therefrom, an outer section 110.6, wherein an intermediate section 110.7 is located between the inner section 110.5 and the outer section 110.6, in the region of which intermediate section the holding units 110.2 are connected to the support membrane element 110.4. With this approach, the potential of the support membrane element 110.4 (decoupling and/or equalizing of the stiffness) can be exploited particularly well.

In the present example, in the region of the outer section 110.6, the support membrane element 110.4 is connected to a circumferential outer ring structure 110.8 extending in the circumferential direction U, while in the region of the inner section 110.5, the support membrane element 110.4 is connected to a circumferential thin-walled inner ring structure 110.9 extending in the circumferential direction U.

In the present example, both the outer ring structure 110.8 and the inner ring structure 110.9 are disposed at a back side of the support membrane element 110.4 facing away from the front side of the support membrane element 110.4. Thus, both the outer ring structure 110.8 and the inner ring structure 110.9 consequently point away from the optical element 109. However, it is understood that, in other variants, the outer ring structure 110.8 and/or the inner ring structure 110.9 can wholly or partly protrude beyond the support membrane element 110.4 in the direction of the optical element 109.

Here, in the radial direction R, the position where the holding units 110.2 are connected to the support membrane element 110.4 has an influence on the decoupling attained by the support membrane element 110.4 and on the stiffness between the holding unit 110.2 and the respective support interface unit 110.3. The closer this connecting point of the holding unit 110.2 approaches one of the stiffening ring structures 110.8, 110.9, the lower is the degree of decoupling or the higher is the value of this stiffness. Therefore, in general (for any configuration), a particularly high degree of decoupling is achieved if the distance of this connecting point of the holding unit 110.2 from a stiffening structure (e.g., one of the ring structures 110.8, 110.9) is as large as possible. In the present example, this can be achieved by virtue of the connecting point of the respective holding unit 110.2 being disposed (in the radial direction R) in the central region of the support membrane element 110.4, e.g., approximately centrally between the stiffening ring structures 110.8, 110.9. From this, it is evident that the position of the connecting point of the holding unit 110.2 is a further parameter by which the stiffness distribution among the holding units 110.2 can be set.

In addition to desirably making the holding device 110 stiffer, in some embodiments, the inner and outer ring structure 110.9, 110.8 can each be advantageous in that an additional adaptation of the stiffness distribution among the holding units 110.2 is possible in a comparatively simple and flexible manner by way of the design of the ring structure and/or the connecting thereof to the support membrane element 110.4.

In the present example, the holding units 110.2 project from the base unit 110.1 in a manner substantially perpendicular to the plane of main extension of the base unit 110.1. This yields a crown-like design, in which the holding units 110.2 project from the ring-shaped base unit 110.1 in the manner of the tines of a crown.

Here, particularly simple connecting of the holding device 110 to the outer support structure 102.1 is realized byway of the outer ring structure 110.8 by virtue of the support interface units 110.3 being formed at the outer ring structure 110.8. However, it will be appreciated that, in other variants, at least some of the support interface units 110.3 may also be formed at the inner ring structure 110.9. For example, it is also possible for all support interface units 110.3 to be formed at the inner ring structure 110.9.

In certain variants, the support interface units 110.3 can be distributed uniformly along the circumference of the holding device 110. However, in the present example, the adaptation potential with respect to the stiffness distribution takes effect particularly well since the support interface units 110.3 are distributed at irregular intervals along the circumferential direction U, for example because this is predetermined by the optical element 109 and/or adjacent components of the imaging device 101.

In order to obtain a good, narrow-band distribution of the stiffness (with respect to the support interface units 110.3) among the holding units 110.2, web elements 110.10 are provided in the present example, the web elements being disposed in pairs 110.11 and interconnecting the outer ring structure 110.8 and the inner ring structure 110.9 (see especially FIG. 4). Here, a gap 110.12 is formed in each case between the web element 110.10 and the support membrane element 110.4 in the direction of the thickness dimension D of the support membrane element 110.4.

Here, the force flow between the respective support interface unit 110.3 and the respective holding unit 110.2 (only schematically indicated in FIG. 4) can be directed and distributed in expedient fashion by way of the arrangement and/or design of the respective web element 110.10, as a result of which it is also possible to influence or set the stiffness of the respective holding unit 110.2 in relation to the respective support interface unit 110.3.

Here, the gap 110.12 ensures that the decoupling potential of the support membrane element 110.4 is not restricted or, where appropriate, influenced in defined fashion. Thus, the gap can extend over at least 50% (e.g., at least 70%, at least 90%, from 90% to 100%) of the length of the web element 110.10 between the outer ring structure 110.8 and the inner ring structure 110.9. Naturally, regions in which no gap 110.12 is present (e.g., in which the web element 110.10 contacts the support membrane element 110.4) in this case restrict the deformability of the support membrane element 110.4 in this region. Consequently, such regions have the effect of increasing stiffness.

In the present example, three pairs 110.11 of mutually assigned web elements 110.10 are provided. However, it is understood that, depending on the stiffness distribution to be obtained, any number of pairs 110.11 of web elements 110.10 can be provided as a matter of principle.

In the present example, the two web elements 110.10 of the respective pair 110.11 engage the inner ring structure 110.9 immediately in succession in the circumferential direction U. This can allows the force flow and hence the stiffness distribution to be set in an expedient fashion. Furthermore, the two web elements 110.10 of the respective pair 110.11 likewise engage immediately in succession on the outer ring structure 110.8. Consequently, the web elements 110.10 of different pairs 110.11 do not cross each other. However, it is understood that, in other variants, the web elements 110.10 of different pairs 110.11 can also cross where used; naturally, this then yields a further stiffening of the holding device 110.

The arrangement or distribution of the web elements 110.10 over the circumference of the holding device 110 can be implemented in any suitable fashion, depending on the stiffness distribution among the holding units 110.2 to be obtained. In certain variants like the present example, the two web elements 110.10 of the respective pair 110.11 engage the outer ring structure 110.8 between two support interface units 110.3 which immediately succeed each other in the circumferential direction U. This allows a particularly expedient distribution or setting of the force flow, and hence of the stiffness (in one or more degrees of freedom), to be obtained between the support interface units 110.3 and the holding units 110.2.

In the present example, the longitudinal axes 110.13 of the two web elements 110.10 of the respective pair 110.11 extend collinear to one another. However, in other variants, the web elements 110.10 of the respective pair 110.11 may also be aligned with an inclination with respect to one another in order to obtain a desired stiffness distribution among the holding units 110.2. Optionally, the longitudinal axes 110.13 of the two web elements 110.10 extend with an inclination of at most 10° (e.g., at most 5°, at most 2°) with respect to one another in a plan view on the plane of main extension (see FIG. 4).

In the plan view on the plane of main extension, the two longitudinal axes 110.13 of the pairs 110.11 furthermore extend at least substantially parallel to a connecting line 110.14, this connecting line connecting two support interface units 110.3 immediately in succession in the circumferential direction U at the outer ring structure 110.8, the web elements 110.10 of the respective pair 110.11 engaging between the two support interface units. Here, as already mentioned above, the connecting line 110.14 between two support interface units 110.3 is defined by the connection between the points of attack of the resultant support force (of the support structure 102.2 of the imaging device 101) at the respective support interface unit 110.3. As a result of this, it is possible to obtain a particularly expedient distribution of the force flow between the support interface units 110.3 and the holding units 110.2 and hence it is possible to obtain an expedient narrow-band stiffness distribution (in one or more degrees of freedom) between the holding units 110.2.

However, it is understood that the two longitudinal axes 110.13 of the respective pair 110.11 can also extend at an inclination with respect to one another in other variants. However, optionally, the two longitudinal axes 110.13 of the respective pair 110.11 extend with an inclination of at most 30° (e.g., at most 10°, at most 2°) with respect to one another.

In the present example, the support membrane element 110.4 is a thin-walled element, the thickness dimension D of which is significantly smaller (typically by at least one order of magnitude) than its dimensions in the other two spatial directions. In the present example, the support membrane element 110.4, in a sectional plane perpendicular to the circumferential direction U, defines a width dimension B, wherein the thickness dimension D of the support membrane element is 2% to 30% (e.g., form 5% to 25%, from 10% to 20%) of the width dimension B of the support membrane element 110.4. This allows particularly expedient properties to be obtained with respect to the narrow-band stiffness distribution among the holding units 110.2 to be obtained.

Here, the thickness dimension D of the support membrane element 110.2 can vary along the circumferential direction U. For example, the thickness dimension D can vary depending on an angular distance to the closest support interface unit 110.3 along the circumferential direction U. Here, the thickness dimension D can increase with increasing angular distance to the closest support interface unit 110.3. By way of such a variation in the thickness dimension D, it is possible, in each case, to finely set the deformation properties of the support membrane element 110.4 and hence (on its own or together with other measures described herein) obtain the desired narrow-band stiffness distribution among the holding units 110.2. In addition or as an alternative thereto, it is naturally also possible for this purpose to vary the thickness dimension D of the support membrane element 110.4 along the radial direction R. Here, the thickness dimension D can be varied depending on a desired stiffness profile of the support membrane element to be achieved in the radial direction, for example r.

Furthermore, in certain variants, the support membrane element 110.4 can have at least one through opening in at least one region located, in the circumferential direction U, between two immediately adjacent holding units 110.2, for example in each region between two immediately adjacent holding units 110.2, as is indicated in FIG. 4 by the dashed contour 113. In this way too, a corresponding option for taking influence on the deformation properties of the support membrane element 110.4 arises and, in turn, the narrow-band stiffness distribution among the holding units 110.2. The size and/or position and/or form of the respective through opening 113 in this case renders it possible to influence the stiffness particularly precisely.

As may be gathered from FIG. 3, for example, each holding unit 110.2 in the present example has a first clamping element 110.15 (an outer clamping element in the radial direction R in this case) and a second clamping element 110.16 (an inner clamping element in the radial direction R in this case). Here, the first clamping element 110.15 can be connected to the base unit 110.1 via a first connection section 110.17, as indicated in FIG. 3 by the dashed contour 110.17. However, the first connection section 110.17 may also be lacking and the first clamping element 110.15 may also not be connected directly to the base unit 110.1. In any case, the second clamping element 110.16 is connected to the base unit 110.1 via a second connection section 110.18.

For the purposes of establishing the clamping connection to the optical element 109, the first clamping element 110.15 and the second clamping element 110.16 are braced against one another by way of a tensioning element 111 in the form of a tensioning screw. Here, an associated interface section 109.3 of the optical element 109 is respectively clamped between the first clamping element 110.15 and the second clamping element 110.16 of the respective holding unit 110.2.

However, the clamping connection between the respective holding unit 110.2 and the optical element 109 may also have a different design in other variants. Thus, the frictional engagement for the clamping may also be realized by only a single clamping element 110.15 or 110.16 per holding unit 110.2, where appropriate, provided the clamping element 110.15 or 110.16 is pressed against the associated contact surface on the interface section 109.3 of the optical element 109 by way of a suitable tensioning device (e.g., a connection section 110.17 or 110.18 under appropriate pretension in the radial direction R) to obtain the frictional engagement of the clamping. The corresponding opposing forces can then be applied by one or more adjacent holding units 110.2 in such a way that the contact forces acting on the optical element 109 in the assembled state cancel one another section-wise, but at least cancel each other overall, and a defined position and orientation of the optical element 109 is achieved.

In the present example, the tensioning element 111 is designed in the manner of a tie rod. The tensioning element 111 reaches with play through a recess 109.4 in the interface section 109.3, as a result of which a particularly uniform distribution of the clamping force is obtained. Due to the play between the tensioning element 111 and the interface section 109.3 in the region of the recess 109.4, contact between the tensioning element 111 and the interface section 109.3, which could otherwise lead to parasitic stresses in the optical element 109, is avoided.

Consequently, here, perpendicular to the radial direction R, only the frictional engagement of the clamping connection is present between the contact surfaces of the clamping elements 110.15, 110.16 and the associated contact surfaces of the interface section 109.3 which is precisely defined by way of the pretension of the tensioning element 111. In some embodiments, this is advantageous in that the holding force resulting from the clamping, and hence the contact force at the clamping surfaces, can be set with comparatively high precision by way of the pretension in the tensioning element 111.

The tensioning element 111 is guided through a through opening in the outer, first clamping element 110.16 and through the recess 109.9. In the present example, the tensioning element 111 includes a threaded section 111.1 which is screwed into a corresponding threaded bore in the inner, second clamping element 110.16 for bracing purposes. By contrast, the screw head 111.2 of the tensioning element 111 rests on the outer, first clamping element 110.16.

In the present example, a compensation spring device 111.3 is provided between the screw head 111.2 and the first clamping element 110.16, the compensation spring device being configured to reduce tensioning force losses in the tensioning element 111. In principle, this compensation spring device 111.3 can be designed in any suitable desired way. To this end, in the present example, the compensation spring device 111.3 is simply designed in the manner of a cup spring or a cup spring packet. However, any other suitable compensation spring devices may also be used.

The first connection section 110.17 can be connected to the second connection section 110.18, as indicated in FIG. 3. In some embodiments, this is advantageous if the respective connection section 110.17, 110.18 of the two clamping elements 110.15, 110.16 then restricts a degree of rotational freedom about an axis that extends substantially parallel to the longitudinal axis of the threaded portion 111.1. This ensures that the respective connection section 110.17, 110.18 can take up at least a majority of the tightening torque of the screw connection in a simple fashion such that insofar no parasitic stresses or only very low parasitic stresses are introduced into the optical element.

To this end, like in the present example, the respective connection section 110.17, 110.18 can be configured in the manner of a leaf spring, the leaf spring in the present example extending substantially in a plane perpendicular to the radial direction R. This yields a particularly simple and compact configuration. Moreover, the respective connection section 110.17, 110.18 is compliant in the radial direction R as a result thereof. In some embodiments, this can be advantageous, for example, in case the optical element 109 and the holding device 110 have different coefficients of thermal expansion. This radial compliance then allows good thermal deformation decoupling to be obtained between the optical element 109 and the holding device 110.

The first connection section 110.17 and the second connection section 110.18 extend substantially parallel to one another, as a result of which a configuration that is particularly easy to produce and assemble is obtained. Moreover, in some embodiments, this configuration can be advantageous from dynamic points of view as it can be stiff in the degrees of freedom that are parallel to the plane of the respective connection section 110.17, 110.18.

In the case of a gravity-caused wave-shaped deformation of the holding device 110 (between the support interface units 110.3 at which the support structure 102.1 is connected), there can be a tilt of the holding units 110.2 with respect to one another about a tilt axis that is parallel to the radial direction R in each case. In this case, the stiffness of the connection section 110.18 would lead to a change in the distance between adjacent clamping elements 110.16, as a result of which parasitic stresses are introduced into the optical element 109. The connection of the connection section 110.18 to the support membrane element 110.4 can significantly reduce these parasitic stresses since the support membrane element 110.4 can absorb the arising constraining forces by way of an elastic deformation in the form of local bulging.

A parallel guide can be realized with the first connection section 110.17 and the second connection section 110.18 in further variants if the first connection section 110.17 is likewise configured as a straight-line leaf spring that extends parallel to the second connection section 110.18. Here, in some embodiments, a slightly modified design can be advantageous, in which both leaf springs are bound to the support membrane element 110.4. The clamping elements 110.15, 110.16 that are braced against one another are then guided substantially parallel to the radial direction R as a result thereof. Hence, in some embodiments, the above-described radial compliance (for thermal deformation decoupling purposes) can be obtained with dynamically high stiffness in the remaining degrees of freedom.

In the present example, the respective interface section 109.3 of the optical element 109 is formed at a projection 109.5 circumferentially extending (in the circumferential direction U) in a ring-shaped manner on the back side of the optical element 109 (facing away from the optical surface 109.1). Here, the projection 109.5 extends in the circumferential direction U and in a direction perpendicular to the plane of main extension of the optical element 109 (e.g., the plane defined by the circumferential direction U and the radial direction R).

In the present example, all interface sections 109.3 are formed at the common projection 109.5. In other variants, the projection 109.5 may also be interrupted in the circumferential direction U, however, and so the interface sections 109.3 may be provided individually or in groups, in each case at a separate circumferential segment of the projection 109.5.

In the present example, a design that is realizable particularly easily and with high precision emerges by virtue of the fact that the respective interface section 109.3 is formed by an interface element 109.6 that is connected to the optical element 109 in the region of the projection 109.5. The interface element 109.6 is configured as a connection bushing with a collar 109.7 which is inserted into a recess 109.8 of the projection 109.5 of the optical element 109 and which is attached there in a suitable manner (e.g., via an adhesive connection by way of adhesive bonding, soldering, etc.).

This configuration is particularly easy to produce since the connection bushing 109.6 forms the contact surfaces to the camping elements 110.15, 110.16. It is substantially easier to establish these contact surfaces to the clamping elements 110.15, 110.16 at the ends of the connection bushing 109.6 than at the projection 109.5. Thus, only the radial recesses 109.8 need to be produced on the projection 109.5, in which the connection bushings 109.6 can be mounted comparatively easily with a sufficiently high precision.

However, it is understood that, in other variants, the respective interface section 109.3 may also be directly formed at the main body 109.2 of the optical element 109, for example at the projection 109.5.

The interface sections 109.3 and the holding units 110.2 may be combinable with one another as desired; e.g., no specific pairing between the interface sections 109.3 and the holding units 110.2 may be prescribed (for example, the optical element 109 and the base unit 110.1 with its holding units 110.2 can thus be arbitrarily rotated with respect to one another along the circumferential direction U).

In other variants, however, such a specific pairing can be defined by a correspondingly different design and/or arrangement of the components of the interface sections 109.3 and the holding units 110.2. In this case, an interface section 109.3 can be configured in such a way that, although it is combinable with a (first) holding unit 110.2, it is not combinable with another (second) holding unit 110.2.

In view of a stress-free or defined assembly (with the generation of parasitic stresses in the optical element 109 at least being largely avoided), in some embodiments, it can be advantageous if the respective clamping connections between three holding units 110.2 of the holding device 110 and the optical element 109 are initially established in a first step during the assembly in such a way that the optical element is secured in space with respect to the base unit 110.1. Thus, securing in the manner of a conventional three-point support can consequently be realized first.

This may be achieved by three (first) holding units 110.2 which are specifically designed for this initial attachment of the optical element 109 and which differ from the remaining holding units 110.2. In the present example, these may be the holding units 110.2 at the three positions 112.1, 112.2 and 112.3 (see FIG. 2), which are each disposed in a manner rotated through 120° in the circumferential direction with respect to one another. For example, these three (first) holding units 110.2 may have an inherently more rigid design than the remaining (second) holding units 110.2.

Then, the respective clamping connections between the remaining (second) holding units 110.2 of the holding device 110 and the optical element 109 are established in a second step of the assembly, which second step follows the first step. The remaining (second) holding units 110.2 may have a significantly lower stiffness in the direction of the movement for clamping purposes (e.g., in the radial direction R in the present example) than the three (first) holding units 110.2 so as thus to be able to compensate production inaccuracies without generating noteworthy restoring forces and, hence, parasitic stresses.

In the present example, the inner clamping element 110.16 of the respective holding unit 110.2 represents a holding interface unit for connecting the optical element 109 within the meaning of the present disclosure. For each holding unit 110.2, a first stiffness S1 in a first direction perpendicular to the plane of main extension of the optical element 109 (e.g., in the z-direction in the present example) and a second stiffness S2 about an axis parallel to the radial direction R is defined for this holding interface unit 110.16 with respect to a respective one of the support interface units 110.3.

The holding device 110, for example its part including the base unit 110.1 and for example the support membrane element 110.4, by adapting the influence parameters presented (in the present disclosure) is configured in such a way that, for all support interface units 110.3, and for a (first) group of holding units 110.2 including at least 80% (e.g., at least 90%, at least 95%, from 95% to 100%) of the holding units 110.2, a variation of the first stiffness S1 between the holding units of this (first) group of holding units 110.2 is at most 900% (e.g., at most 100%, at most 10%, from 10% to 1%) of the smallest first stiffness S1 of the holding units 110.2 of this (first) group of holding units 110.2 (e.g., the smallest value of the first stiffness S1 present among the holding units 110.2 of this (first) group of holding units 110.2). In this way, a particularly expedient, narrow-band stiffness distribution is obtained in the first direction (e.g., perpendicular to the plane of main extension of the optical element 109).

It will be appreciated that such an adaptation of the stiffness distribution among the holding units 110.2 for a single degree of freedom, for example any relevant degree of freedom, for example the degree of freedom in which the main shock loads are to be expected, may suffice as a matter of principle. Optionally, such an adaptation is also implemented in further degrees of freedom. Likewise, it is naturally possible to also undertake the adaptation in one or more other degrees of freedom only.

In the present example, such an adaptation is optionally also implemented with respect to the second stiffness S2. To this end, the holding device 110, for example the part including the base unit 110.1 and for example the support membrane element 110.4, is configured in such a way that, for all support interface units 110.3, and for a further (second) group of holding units 110.2 including at least 80% (e.g., at least 90%, at least 95%, from 95% to 100%) of the holding units 110.2 of this further (second) group of holding units 110.2, a variation of the second stiffness S2 between the holding units 110.2 of this further (second) group of holding units 110.2 is at most 900% (e.g., at most 100%, at most 10%, from 10% to 1%) of the smallest second stiffness S2 of the holding units 110.2 of this further (second) group of holding units 110.2. It will be appreciated that the first and second groups of holding units 110.2 may be identical. However, they may also be different by one or more holding units 110.2.

In principle, the optical element 109 can be produced from any suitable material in single part or multi-part fashion. Optionally, the optical element 109, at least in the region of the projection 109.5, is produced from a ceramic material, the ceramic material for example including SiSiC, and/or produced from a material including Zerodur and/or from a lens material. In the above-described variants with an interface element 109.6, the latter can be optionally produced from a material including Invar and/or stainless steel and/or molybdenum.

In principle, the holding device 110 may be constructed in any suitable manner from a plurality of separate components in a so-called differential construction. In the present example, the base unit 110.1 is configured to be monolithic with the support membrane element 110.4 and all holding units 110.2, as a result of which a particularly robust and highly precisely produced design arises.

In principle, any suitable material can be used for the holding device 110 or the components thereof. This can be, e.g., stainless steel, aluminum (Al) or beryllium (Be), either individually or in any combination. Further suitable materials include aluminum alloys (e.g., aluminum silicon (AlSi)), beryllium alloys (e.g., aluminum beryllium (AlBe)), ceramic materials (e.g., SiSiC), glass fiber-reinforced plastics (GFRP) and carbon fiber-reinforced plastics (CFRP).

Using the designs described above, it is possible to perform the methods according to the disclosure as described above. In this respect, reference is therefore made to the explanations given above in order to avoid repetition.

Second Embodiment

An embodiment of the arrangement 208 according to the disclosure, which can be used instead of the arrangement 108 in the imaging device 101, is described below with reference to FIGS. 1, 2 and 5 to 7. The arrangement 208 corresponds in its basic design and functionality to the arrangement 108 from FIGS. 2 to 4, and so only the differences are to be discussed here. For example, identical components are provided with identical reference signs, while similar components are provided with reference signs increased by the value 100. Unless otherwise stated below, reference is made to the above statements in connection with the first embodiment with regard to the aspects of these components.

The difference with respect to the design of the first embodiment substantially involves the design of the base unit 210. In the present example, the support membrane element 210.4 is connected on a back side facing away from its front side (or the optical element 109) to a circumferential support ring structure 210.21 extending in the circumferential direction U. Here, the three support interface units 110.3 are once again formed on the support ring structure 210.21. Here, too, in certain variants, a uniform distribution of the support interface units 110.3 can be provided over the circumference of the base unit 210. However, in the present example, the support interface units 110.3 can once again distributed at irregular intervals along the circumferential direction since, in some embodiments, the advantages of the design with the support membrane element 210.4 can take effect here.

In the present example, the support membrane element 210.4 is continuously connected to the support ring structure 210.21. Thus, there is no gap (similar to the gap 110.12) between the support ring structure 210.21 and the support membrane element 210.4. However, it is understood that, in other variants, such a gap (similar to the gap 110.12) can also be provided at least section-wise as described above in conjunction with the web elements 110.11 of the first embodiment in order to release, at least section-wise, the deformation capability of the support membrane element 210.4 in this region.

In the design of the present example, too, the force flow between the support interface units 110.3 and the individual holding units 210.2, and hence the stiffness distribution among the holding units 210.2, can be set by way of the design and/or the course of the support ring structure 210.21. To this end, in the present example, a respective distance of the support ring structure 210.21 from the inner section 210.5 (e.g., the inner edge 210.22), of the support membrane element 210.4 varies along the circumferential direction U between the support interface units 110.3 immediately succeeding each other in the circumferential direction.

In the present example, the support ring structure 210.21 connects the support interface units 110.3 immediately succeeding each other in the circumferential direction, substantially along the shortest possible path without protruding, in the radial direction R, inwardly beyond the inner edge 210.22 of the support membrane element 210.4. Particularly expedient force flow distributions can be obtained therewith.

It will be appreciated that, for the holding device 210, the combination of the support membrane element 210.4 and the support ring structure 210.21 may suffice as a matter of principle. However, in the present example, the support ring structure is connected on a back side facing away from the support membrane element 210.4 to a thin-walled stiffening membrane element 210.23, which predominantly extends along the circumferential direction U and along the radial direction R. In some embodiments, this can advantageously increase the stiffness of the holding device 210 overall, as a result of which, high resonant frequencies of the holding device 210 can arise.

Here, as a matter of principle, the stiffening membrane element 210.23 can be designed in any suitable way for obtaining the desired stiffening effect. In the present example, it has a substantially identical structure to the support membrane element. Consequently, the stiffening membrane element 210.23, too, is configured in the manner of a thin-walled ring-shaped disc, the sectional contour of which, in the sectional plane illustrated in FIG. 5, extends substantially parallel to the radial direction R. With respect to the design and arrangement of the stiffening membrane element 210.23, too, the explanations with respect to the support membrane element 110.4 or 210.4, made above, apply as a matter of principle, and so reference is made thereto in this respect.

In these designs, too, the holding units 210.2 can be configured in principle in any suitable form for holding the optical element 109. In the present example, the holding units 210.2 are connected to the support membrane element 210.4 via a decoupling section 210.24. This easily ensures that a restriction of the deformation capability of the support membrane element 210.4 by the rearward support ring structure 210.21 is compensated by this decoupling section 210.24. Here, as a matter of principle, the decoupling via the decoupling section 210.24 can have any design and can be matched to the desired degree or degrees of freedom, in which the decoupling is desired. In the present example, the decoupling section 210.24 is configured as a narrow web, and so the decoupling section 210.24 releases a tilt degree of freedom about a tilt axis parallel to the radial direction R.

As may be gathered from FIGS. 6 and 7, for example, a difference between the holding units 210.2 and the holding units of the first embodiment involves the fact that the compliance of the holding elements 210.2 in the radial direction R is caused by the inner clamping element 110.16 being held by way of a leaf spring element 210.18. The leaf spring element 210.18 is elongate along the circumferential direction U and extends (in the circumferential direction U) to both sides of the clamping element 110.16 in a plane perpendicular to the radial direction R. At its ends, the leaf spring element 210.18 is connected to a base body 210.25 of the holding unit 210.2. Once again, the main body 210.25 is connected via the decoupling section 210.24 to the support membrane element 210.4.

As a result of this design of the holding units 210.2, it is possible to obtain a configuration with a small size perpendicular to the plane of main extension of the optical element 109. This renders it possible either to save installation space in the direction perpendicular to the plane of main extension of the optical element 109 (here: z-direction) or to increase the dimension of the support ring structure 210.21 in this direction, as a result of which the stiffness of the base unit 210.1 can be significantly increased. In some embodiments, this can be advantageous from dynamic points of view in relation to the resonant frequencies of the holding device 210.

This design also makes it possible to realize the above-described methods according to the disclosure in the same way, and so reference is made to the explanations given above in this respect.

It will be for example appreciated that the adaptation of the stiffness distribution among the holding units 210.2 may be achieved to the same extent as it has been described above for the first and second stiffness and/or for any other single or multiple degrees of freedom, for example any relevant degree of freedom, for example the degree of freedom in which the main shock loads are to be expected. This may again be achieved via the holding device 210, for example its part including the base unit 210.1 and for example the support membrane element 210.4, for example, by adapting the influence parameters as presented in the present disclosure.

The disclosure is described above on the basis of examples in the area of microlithography. However, the disclosure is not limited in this sense. Instead, the technology provided in the disclosure can also be used in the context of any other optical applications, such as imaging methods at different wavelengths, in which similar considerations can arise with respect to the support of heavy optical units.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place both substantially at the same wavelength as is used in the later microlithographic process. However, it is likewise possible also to use any desired wavelengths deviating therefrom for the inspection.

The disclosure has been described above on the basis of embodiments showing combinations of features. The disclosure is not limited to such embodiments. Rather, all other combinations of features such as are evident from the following claims also belong to the subject matter of the disclosure.

What is claimed is:

1. An arrangement, comprising:
a device, comprising:
a base unit, comprising:
a plurality of interface units;
a first membrane element; and
a plurality of separate holding units connected to the base unit,
wherein:
the device is configured to hold an optical element comprising an optical surface;
the optical element defines a plane of main extension having a radial direction and a circumferential direction;
the interface units are spaced apart from one another in the circumferential direction;
the interface units are configured to connect the device to a support structure;
the holding units are spaced apart from one another and distributed along the circumferential direction;
the holding units are configured to hold the optical element with respect to the base unit;
the first membrane element predominantly extends along the circumferential direction and the radial direction;

the holding units are supported on a first side of the first membrane element; and the first side of the first membrane element faces the optical element.

2. The arrangement of claim 1, wherein the first membrane element comprises a member selected from the group consisting of a thin-walled ring-shaped disc and a thin-walled hollow conical frustum.

3. The arrangement of claim 1, wherein the first membrane element comprises has an inner section and an outer section that is spaced apart from the inner section in the radial direction.

4. The arrangement of claim 3, wherein the first membrane element comprises has an intermediate section between the inner section and the outer section, and/or wherein, in the radial direction, at least one of the holding units is connected to the first membrane element between the inner and outer sections.

5. The arrangement of claim 3, further comprising an outer ring structure extending in the circumferential direction wherein, in a region of the outer section, the first membrane element is connected to the outer ring structure.

6. The arrangement of claim 5, further comprising an inner ring structure extending in the circumferential direction, wherein, in a region of the inner section, the first membrane element is connected to the inner ring structure.

7. The arrangement of claim 6, further comprising a web element interconnecting the inner and outer ring structures.

8. The arrangement of claim 3, further comprising a ring structure extending in the circumferential direction, wherein, at second side facing away from the front side, the first membrane element is connected to a ring structure.

9. The arrangement of claim 8, wherein at least one holding unit located immediately adjacent in the circumferential direction is connected to the first membrane element via a decoupling section.

10. The arrangement of claim 1, wherein:
the first membrane element has a thickness dimension transverse to the circumferential direction and radial direction;
the first membrane element has a width dimension in a plane perpendicular to the circumferential direction; and
the thickness dimension of the first membrane element is from 2% to 30% of the width dimension of the first membrane element.

11. The arrangement of claim 1, wherein:
the first membrane element has a thickness dimension transverse to the circumferential direction and radial direction; and
the thickness dimension of the first membrane element varies along the circumferential direction.

12. The arrangement of claim 1, wherein:
the first membrane element has a thickness dimension transverse to the circumferential direction and radial direction; and
the thickness dimension of the first element varies along the radial direction, wherein the thickness dimension.

13. The arrangement of claim 1, wherein the first membrane element comprises a through opening in a region located, in the circumferential direction, between two immediately adjacent holding units.

14. The arrangement of claim 1, wherein each holding unit comprises a holding interface unit configured to connect the optical element.

15. The arrangement of claim 1, wherein each holding unit is configured to establish a clamping connection between the optical element and the base unit.

16. The arrangement of claim 15, wherein the clamping connection is separate from the other holding units, and/or wherein at least one of the holding units comprises a holding interface unit configured to connect the optical element, and the holding interface unit comprises first and second clamping elements braced against one another to establish the clamping connection.

17. The arrangement of claim 15, further comprising a tensioning element, wherein, to establish the clamping connection the first and second clamping elements are braced against one another via the tensioning element.

18. The arrangement of claim 17, further comprising a spring device configured to reduce tensioning force losses in the tensioning element.

19. The arrangement of claim 1, wherein:
each holding unit comprises a holding interface unit configured to connect to the optical element; and
at least one holding interface unit is connected to the first membrane element via a connection section.

20. The arrangement of claim 1, wherein at least one holding interface section of the optical element comprises a projection of the optical element.

21. The arrangement of claim 20, wherein a plurality of holding interface sections are disposed at a common projection of the optical element.

22. The arrangement of claim 1, wherein at least one holding interface section of the optical element comprises a holding interface element connected to the optical element.

23. The arrangement of claim 22, wherein, at least in a region of the projection, the optical element comprises a material selected from the group consisting of a ceramic material, Zerodur and a lens material.

24. The arrangement of claim 22, the interface element comprises a material selected from the group consisting of invar, stainless steel and molybdenum.

25. The arrangement of claim 1, wherein the optical surface comprises a reflecting optical surface, wherein the optical surface is supported by a main body of the optical element, and the main body comprises a projection on a side facing away from the optical surface, and wherein the projection defines an interface to at least one of the holding units.

26. The arrangement of claim 1, wherein the base unit is a ring-shaped configuration.

27. The arrangement of claim 1, wherein the base unit defines a plane of main extension of the base unit, and at least one of the holding units projects from the base unit substantially perpendicular to the plane of main extension of the base unit.

28. The arrangement of claim 1, wherein the base unit is monolithic, and/or the first membrane element is monolithic with at least one of the holding units.

29. The arrangement of claim 1, comprising at least six holding units.

30. The arrangement of claim 1, wherein the holding units are substantially uniformly distributed distribution along the circumferential direction.

31. An optical imaging device, comprising:
an illumination device; and
a projection device,
wherein:
the illumination device is configured to illuminate an object;

the projection device is configured to project an image of the object onto an image device; and at least one member selected from the group consisting of the illumination device and the projection device comprises an arrangement according to claim 1.

32. A method, comprising:

using the device of claim 1 to support an optical element.

33. A method of using an optical imaging device comprising an illumination device and a projection device, the method comprising:

using the illumination device to illuminate an object; and using the projection device to project an image of the object onto an image device, wherein at least one member selected from the group consisting of the illumination device and the projection device comprises an arrangement according to claim 1.

34. An arrangement, comprising:

a device, comprising:

a base unit, comprising:

a plurality of interface units;

a first membrane element; and a plurality of separate holding units connected to the base unit, wherein:

the device is configured to hold an optical element comprising an optical surface;

the optical element defines a plane of main extension having a radial direction and a circumferential direction;

the interface units are spaced apart from one another in the circumferential direction;

the interface units are configured to connect the device to a support structure;

the holding units are spaced apart from one another and distributed along the circumferential direction;

the holding units are configured to hold the optical element with respect to the base unit;

each holding unit comprises a holding interface unit to connect to the optical element;

with respect to a respective one of the support interface units, each holding interface unit of each holding unit has a first stiffness in a first direction;

at least part of the holding device comprising the first membrane element is configured in so that, for at least one support interface unit and for a group of holding units comprising at least 80% of the holding units, a variation of the first stiffness among the holding units is at most 900% of a smallest first stiffness of the group of holding units;

the holding units are supported on a first side of the first membrane element; and the first side of the first membrane element faces the optical element.

* * * * *

UNITED STATES PATENT AND TRADEMARK OFFICE
CERTIFICATE OF CORRECTION

PATENT NO. : 11,422,469 B2
APPLICATION NO. : 16/869941
DATED : August 23, 2022
INVENTOR(S) : Christian Körner, Christoph Müller and Eugen Anselm Page 1 of 1

It is certified that error appears in the above-identified patent and that said Letters Patent is hereby corrected as shown below:

In the Specification

Column 7, Line 7, Delete "in in" insert -- in --.

Column 15, Line 25, Delete "object" insert -- object, --.

Column 22, Line 67, Delete "111-111" insert -- III-III --.

Column 26, Line 66, Delete "byway" insert -- by way --.

Column 29, Line 10, Delete "r." insert -- R. --.

Column 31, Line 63, Delete "camping" insert -- clamping --.

Signed and Sealed this
Eleventh Day of October, 2022

Katherine Kelly Vidal
*Director of the United States Patent and Trademark Office*